(12) United States Patent
Lee et al.

(10) Patent No.: US 12,438,091 B2
(45) Date of Patent: Oct. 7, 2025

(54) SEMICONDUCTOR DEVICE INCLUDING A NONVOLATILE VERTICAL MEMORY DEVICE AND ELECTRONIC SYSTEM INCLUDING THE SEMICONDUCTOR DEVICE

(71) Applicant: SAMSUNG ELECTRONICS CO., LTD., Suwon-si (KR)

(72) Inventors: Jaechul Lee, Hwaseong-si (KR); Seungjae Sim, Hwaseong-si (KR); Daehun Choi, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 516 days.

(21) Appl. No.: 17/835,080

(22) Filed: Jun. 8, 2022

(65) Prior Publication Data
US 2023/0108322 A1    Apr. 6, 2023

(30) Foreign Application Priority Data
Oct. 6, 2021   (KR) ........................ 10-2021-0132681

(51) Int. Cl.
*H01L 23/535* (2006.01)
*H01L 23/528* (2006.01)
(Continued)

(52) U.S. Cl.
CPC ........ *H01L 23/535* (2013.01); *H01L 23/5283* (2013.01); *H10B 41/27* (2023.02);
(Continued)

(58) Field of Classification Search
None
See application file for complete search history.

(56) References Cited

U.S. PATENT DOCUMENTS

| 8,435,857 B2 | 5/2013 | Kiyotoshi |
| 9,953,992 B1 | 4/2018 | Ogawa et al. |

(Continued)

FOREIGN PATENT DOCUMENTS

| KR | 10-0531467 | 11/2005 |
| KR | 10-0853800 | 8/2008 |
| KR | 10-2021-0032920 A | 3/2021 |

OTHER PUBLICATIONS

Office Action dated Jun. 19, 2025 issued in corresponding Korean Patent Application No. 10-2021-0132681.

*Primary Examiner* — Bo B Jang
(74) *Attorney, Agent, or Firm* — Morgan, Lewis & Bockius LLP

(57) ABSTRACT

A semiconductor device includes: a stepped connection portion having a plurality of conductive pad portions disposed on a substrate; an insulating block covering the plurality of conductive pad portions, wherein the insulating block has a first surface and a second surface, wherein the first surface faces the stepped connection portion, wherein the second surface is flat and extends in a direction parallel to a first surface of the substrate, wherein the insulating block includes a silicon oxide film doped with a dopant element including a metalloid element or a non-metal element, wherein the dopant element has an atomic weight within a range of 5 to 15; and at least one plug structure passing through the insulating block in a vertical direction with respect to the first surface of substrate.

16 Claims, 39 Drawing Sheets

(51) Int. Cl.
*H10B 41/27* (2023.01)
*H10B 41/41* (2023.01)
*H10B 43/27* (2023.01)
*H10B 43/40* (2023.01)

(52) U.S. Cl.
CPC ............ *H10B 41/41* (2023.02); *H10B 43/27* (2023.02); *H10B 43/40* (2023.02)

(56) References Cited

U.S. PATENT DOCUMENTS

| | | |
|---|---|---|
| 10,937,809 B1 | 3/2021 | Sharangpani et al. |
| 2019/0043830 A1 | 2/2019 | Sakakibara et al. |
| 2021/0066320 A1* | 3/2021 | Kim ..................... H10B 51/00 |
| 2021/0091204 A1 | 3/2021 | Rabkin et al. |
| 2021/0159149 A1 | 5/2021 | Kitazawa |

* cited by examiner

II - II'

SEMICONDUCTOR DEVICE INCLUDING A NONVOLATILE VERTICAL MEMORY DEVICE AND ELECTRONIC SYSTEM INCLUDING THE SEMICONDUCTOR DEVICE

CROSS-REFERENCE TO RELATED APPLICATION

This application claims priority under 35 U.S.C. § 119 to Korean Patent Application No. 10-2021-0132681, filed on Oct. 6, 2021, in the Korean Intellectual Property Office, the disclosure of which is incorporated by reference herein in its entirety.

TECHNICAL FIELD

The present inventive concept relates to a semiconductor device and an electronic system including the same, and more particularly, to a semiconductor device including a nonvolatile vertical memory device and an electronic system including the semiconductor device.

DISCUSSION OF THE RELATED ART

For electronic systems that require data storage, semiconductor devices capable of storing high-capacity data may be implemented therein, and accordingly, a method for increasing the data storage capacity of semiconductor devices has been under development. For example, as one of the methods for increasing the data storage capacity of semiconductor devices, semiconductor devices including a vertical memory device having memory cells arranged three-dimensionally, instead of memory cells arranged two-dimensionally, have been under development.

SUMMARY

According to an exemplary embodiment of the present inventive concept, a semiconductor device includes: a stepped connection portion having a plurality of conductive pad portions disposed on a substrate; an insulating block covering the plurality of conductive pad portions, wherein the insulating block has a first surface and a second surface, wherein the first surface faces the stepped connection portion, wherein the second surface is flat and extends in a direction parallel to a first surface of the substrate, wherein the insulating block includes a silicon oxide film doped with a dopant element including a metalloid element or a non-metal element, wherein the dopant element has an atomic weight within a range of 5 to 15; and at least one plug structure passing through the insulating block in a vertical direction with respect to the first surface of substrate.

According to an exemplary embodiment of the present inventive concept, a semiconductor device includes: a substrate including a memory cell region and a connection region; a first stack disposed at a first vertical level on the substrate and including a plurality of lower gate lines and a lower stepped connection portion, wherein the plurality of lower gate lines overlap each other in a vertical direction, with respect to an upper surface of the substrate, in the memory cell region, and the lower stepped connection portion is disposed in the connection region and has a plurality of lower conductive pad portions integrally connected to the plurality of lower gate lines; a second stack disposed at a second vertical level higher than the first vertical level on the substrate and including a plurality of upper gate lines and an upper stepped connection portion, wherein the plurality of upper gate lines overlap each other in the vertical direction in the memory cell region, and the upper stepped connection portion is disposed in the connection region and has a plurality of upper conductive pad portions integrally connected to the plurality of upper gate lines; a lower insulating block covering the lower stepped connection portion; an upper insulating block covering the upper stepped connection portion and the lower insulating block; and at least one plug structure passing through the lower insulating block and the upper insulating block in the vertical direction, wherein the lower insulating block and the upper insulating block each include a silicon oxide film doped with a first dopant element including a metalloid element or a non-metal element, and wherein the first dopant element has an atomic weight within a range of 5 to 15.

According to an exemplary embodiment of the present inventive concept, an electronic system includes: a main substrate; a semiconductor device disposed on the main substrate; and a controller electrically connected to the semiconductor device, wherein the semiconductor device includes: a stepped connection portion having a plurality of conductive pad portions disposed on a substrate; an insulating block disposed on the plurality of conductive pad portions, wherein the insulating block has a lower surface and an upper surface, wherein the lower surface faces the stepped connection portion, and the upper surface extends in a direction parallel to a main surface of the substrate, wherein the insulating block includes a silicon oxide film doped with a dopant element including a metalloid element or a non-metal element, and wherein the dopant element has an atomic weight within a range of 5 to 15; and at least one plug structure passing through the insulating block in a vertical direction with respect to a first surface of substrate.

BRIEF DESCRIPTION OF THE DRAWINGS

The above and other aspects of the present inventive concept will become more apparent by describing in detail embodiments thereof, with reference to the accompanying drawings, in which:

FIGS. 9A, 9B, and 9C are cross-sectional views illustrating a semiconductor device according to an exemplary embodiment of the present inventive concept, in which FIG. 9A is a cross-sectional view of some components of a portion corresponding to the cross-section taken along line X1-X1' of FIG. 5, FIG. 9B is a cross-sectional view of some components of a portion corresponding to the cross-section taken along line X2-X2' of FIG. 5, and FIG. 9C is a cross-sectional view of some components of a portion corresponding to the cross-section taken along line Y1-Y1' of FIG. 5;

FIGS. 13A, 13B, 13C, 14A, 14B, 15A, 15B, 16A, 16B, 16C, 17A, 178, 17C, 18A, 18B, 18C, 19A, 19B, and 19C are cross-sectional views illustrating a method of manufacturing a semiconductor device according to an exemplary embodiment of the present inventive concept, in which FIGS. 13A, 14A, 15A, 16A, 17A, 18A, and 19A are cross-sectional views illustrating a process sequence of some components of a portion corresponding to the cross-section taken along line X1-X1' of FIG. 5, FIGS. 13B, 14B, 15B, 16B, 17B, 18B, and 19B are cross-sectional views illustrating a process sequence of some components of a portion corresponding to the cross-section taken along line X2-X2' of FIG. 5, and FIGS. 13C, 16C, 17C, 18C, and 19C are cross-sectional views illustrating a process sequence of some components of a portion corresponding to the cross-section taken along line Y1-Y1' of FIG. 5;

DETAILED DESCRIPTION OF THE EMBODIMENTS

Figure 1:
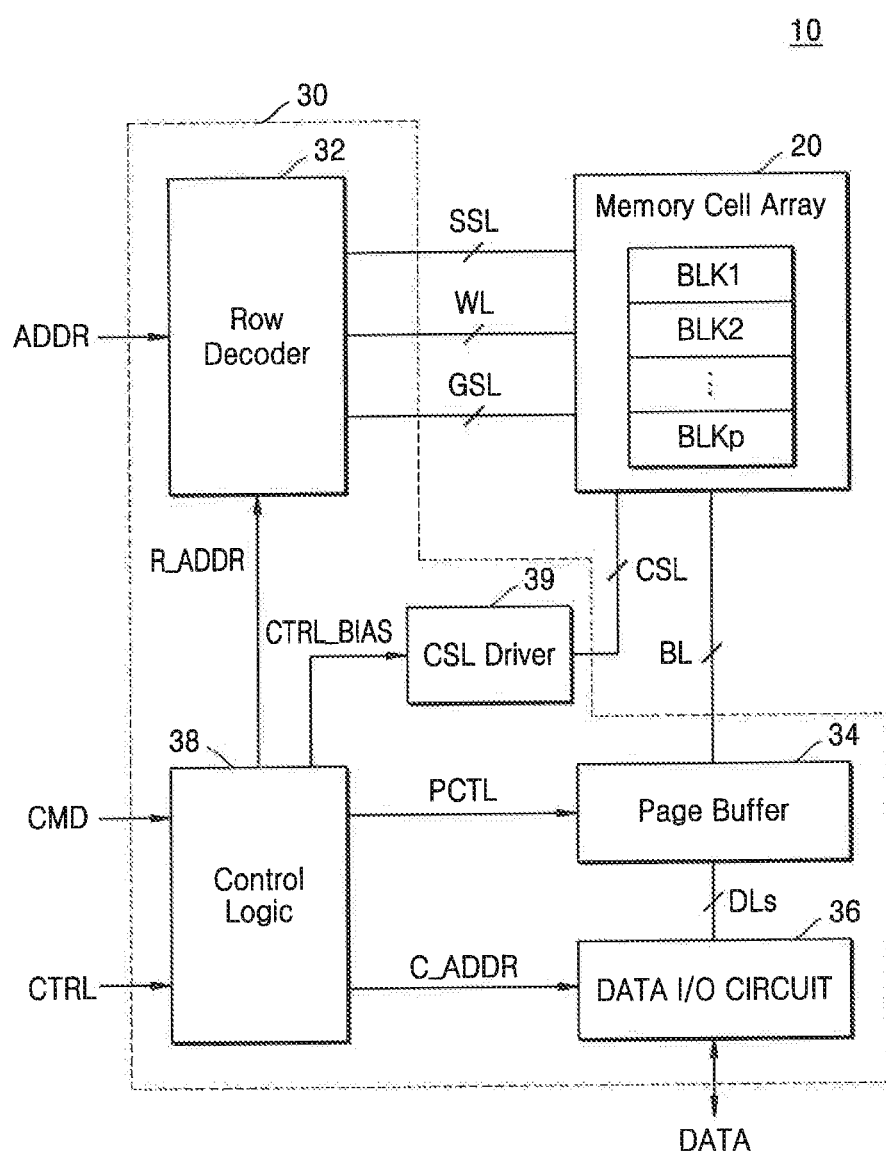
FIG. 1 is a block diagram of a semiconductor device according to an exemplary embodiment of the present inventive concept.

Hereinafter, exemplary embodiments of the present inventive concept are described in detail with reference to the accompanying drawings. The same reference numerals are used for the same components in the drawings, and redundant descriptions thereof may be omitted.

FIG. 1 is a block diagram of a semiconductor device 10 according to an exemplary embodiment of the present inventive concept.

Referring to FIG. 1, the semiconductor device 10 may include a memory cell array 20 and a peripheral circuit 30. The memory cell array 20 includes a plurality of memory cell blocks BLK1, BLK2, . . . , BLKp. Each of the memory cell blocks BLK1, BLK2, . . . , BLKp may include a plurality of memory cells. The memory cell blocks BLK1, BLK2, . . . , BLKp may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, a control logic 38, and a common source line (CSL) driver 39. The peripheral circuit 30 may further include various circuits such as a voltage generating circuit generating various voltages for an operation of the semiconductor device 10, an error correction circuit that corrects an error in data read from the memory cell array 20, and an I/O interface.

The memory cell array 20 may be connected to the row decoder 32 through the word line WL, the string select line SSL, and the ground select line GSL and may be connected to the page buffer 34 through the bit line BL. For example, in the memory cell array 20, each of the memory cells included in the memory cell blocks BLK1, BLK2, . . . , BLKp may be a flash memory cell. The memory cell array 20 may include a three-dimensional (3D) memory cell array. The 3D memory cell array may include a plurality of NAND strings, each of which may include a plurality of memory cells connected to a plurality of vertically stacked word lines WL.

The peripheral circuit 30 may receive an address ADDR, a command CMD, and a control signal CTRL from the outside of the semiconductor device 10, and may transmit and receive data DATA to and from an external device.

The row decoder 32 may select at least one of the memory cell blocks BLK1, BLK2, . . . , BLKp in response to an address ADDR from the outside, and select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through the bit line BL. During a program operation, the page buffer 34 may operate as a write driver to apply a voltage, which is according to the data DATA, to be stored in the memory cell array 20 through the bit line BL, and during a read operation, the page buffer 34 may operate as a sense amplifier to sense the data DATA stored in the memory cell array 20. The page buffer 34 may operate according to a control signal PCTL provided from the control logic 38.

The data I/O circuit 36 may be connected to the page buffer 34 through a plurality of data lines DLs. During the program operation, the data I/O circuit 36 may receive the data DATA from a memory controller and provide program data DATA that is based on a column address C_ADDR, which is provided from the control logic 38, to the page buffer 34. During a read operation, the data I/O circuit 36 may provide the read data DATA that is stored in the page buffer 34 to the memory controller based on the column address C_ADDR that is provided from the control logic 38.

The data I/O circuit 36 may transmit an input address or command to the control logic 38 or the row decoder 32. For example, the peripheral circuit 30 may further include an electro static discharge (ESD) circuit and a pull-up/pull-down driver.

The control logic 38 may receive a command CMD and a control signal CTRL from the memory controller. The control logic 38 may provide a row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust a voltage level provided to the word line WL and the bit line BL when performing a memory operation such as the program operation or an erase operation.

The common source line driver 39 may be connected to the memory cell array 20 through a common source line CSL. The common source line driver 39 may apply a common source voltage (e.g., a power source voltage) or a ground voltage to the common source line CSL based on a control signal CTRL_BIAS from the control logic 38.

Figure 2:
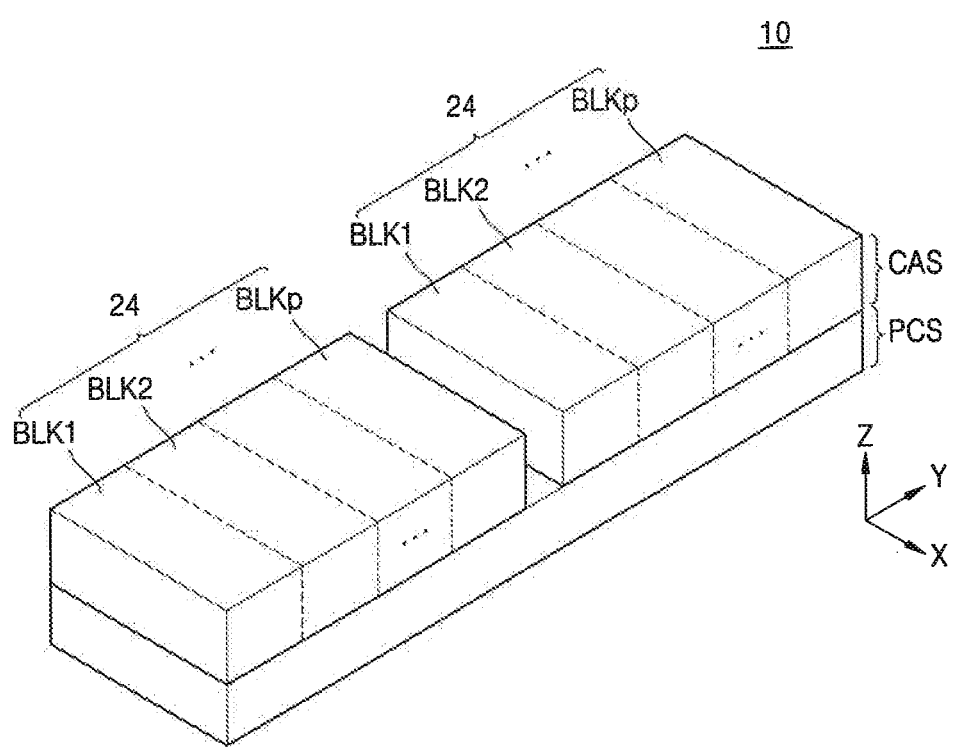
FIG. 2 is a schematic perspective view of a semiconductor device according to an exemplary embodiment of the present inventive concept.

FIG. 2 is a schematic perspective view of the semiconductor device 10 according to an exemplary embodiment of the present inventive concept.

Referring to FIG. 2, the semiconductor device 10 may include a cell array structure CAS and a peripheral circuit structure PCS overlapping each other in a vertical direction (e.g., a Z direction). The cell array structure CAS may include the memory cell array 20 described above with reference to FIG. 1. The peripheral circuit structure PCS may include the peripheral circuit 30 described above with reference to FIG. 1. FIG. 2 illustrates a structure in which the cell array structure (CAS) and the peripheral circuit structure (PCS) are disposed at different vertical levels from each other and overlap each other in the vertical direction (e.g., the Z direction), but the present inventive concept is not limited thereto. For example, the cell array structure CAS and the peripheral circuit structure PCS may be disposed at the same vertical level.

The cell array structure CAS may include a plurality of tiles 24. Each of the tiles 24 may include a plurality of memory cell blocks BLK1, BLK2, . . . , BLKp. Each of the memory cell blocks BLK1, BLK2, . . . , BLKp may include three-dimensionally arranged memory cells.

In an exemplary embodiment of the present inventive concept, two tiles 24 may form one mat, but the present inventive concept is not limited thereto. The memory cell array 20 described above with reference to FIG. 1 may include a plurality of mats, for example, four mats, but present inventive concept is not limited thereto.

Figure 3:
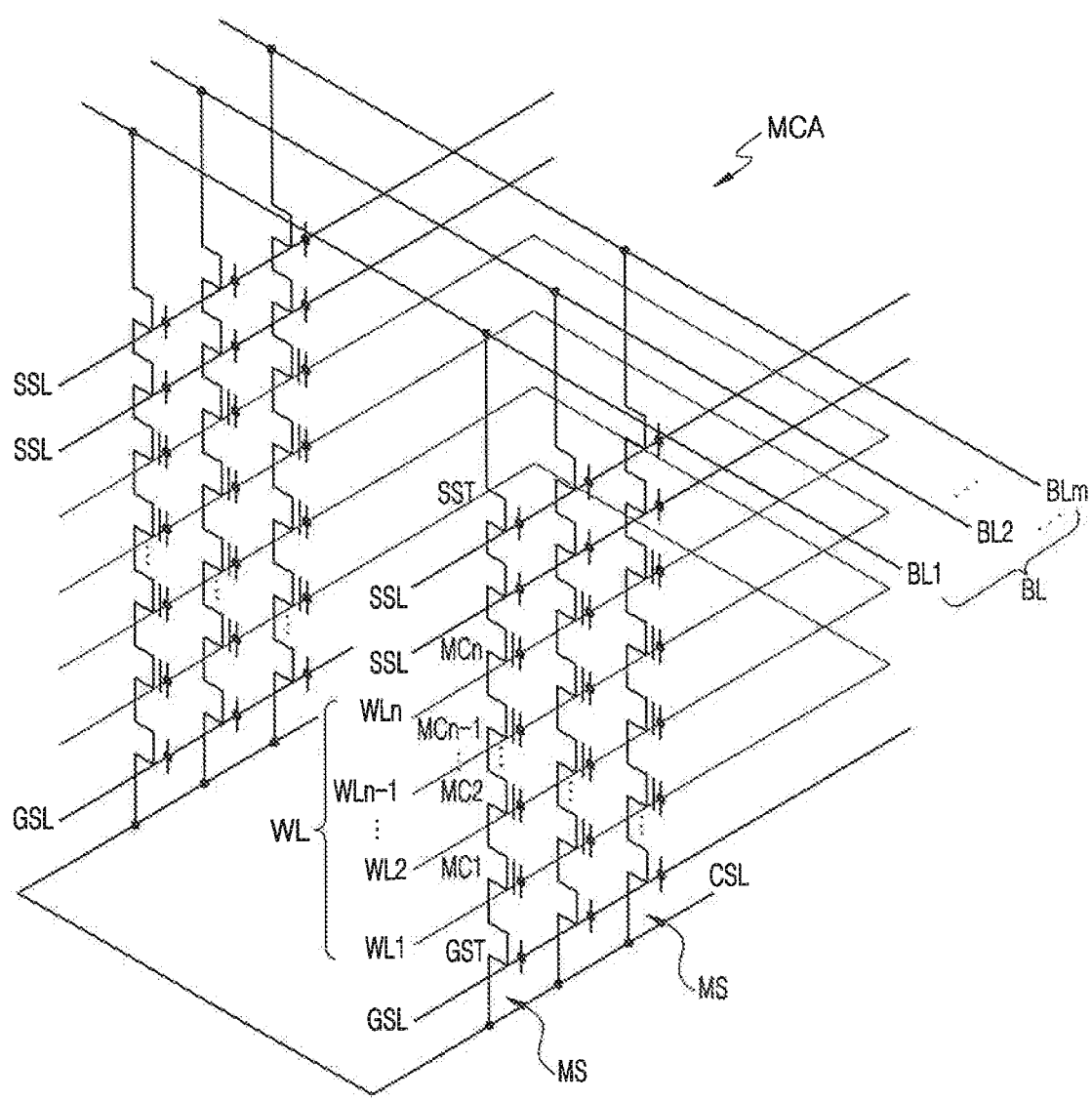
FIG. 3 is a circuit diagram of a memory cell array of a semiconductor device according to an exemplary embodiment of the present inventive concept.

FIG. 3 is a circuit diagram of a memory cell array (MCA) of a semiconductor device according to an exemplary embodiment of the present inventive concept. FIG. 3 illustrates a circuit diagram of a vertical NAND flash memory device having a vertical channel structure. The memory cell blocks BLK1, BLK2, . . . , BLKp illustrated in FIGS. 1 and 2 may each include the memory cell array MCA having the circuit configuration illustrated in FIG. 3.

Referring to FIG. 3, the memory cell array MCA may include a plurality of memory cell strings MS. The memory cell array MCA may include a plurality of bit lines (BL) BL1, BL2, . . . . BLm, a plurality of word lines (WL) WL1, WL2, . . . , WLn−1, WLn, at least one string select line SSL, at least one ground select line GSL, and a common source line CSL. The memory cell strings MS may be formed between the bit lines BL and the common source line CSL. FIG. 3 illustrates a case in which the memory cell strings MS each include one ground select line GSL and two string select lines SSL, but the present inventive concept is not limited thereto. For example, each of the memory cell strings MS may each include only one string select line SSL.

The memory cell strings MS may each include a string select transistor SST, a ground select transistor GST, and a plurality of memory cell transistors MC1, MC2, . . . , MCn−1, MCn. A drain region of the string select transistor SST may be connected to the bit line BL, and a source region of the ground select transistor GST may be connected to the common source line CSL. The common source line CSL may be a region to which the source region of the ground selection transistors GST is commonly connected.

The string select transistor SST may be connected to the string select line SSL, and the ground select transistor GST may be connected to the ground select line GSL. The memory cell transistors MC1, MC2, . . . , MCn−1, MCn may be respectively connected to a word line WL.

Figure 4:
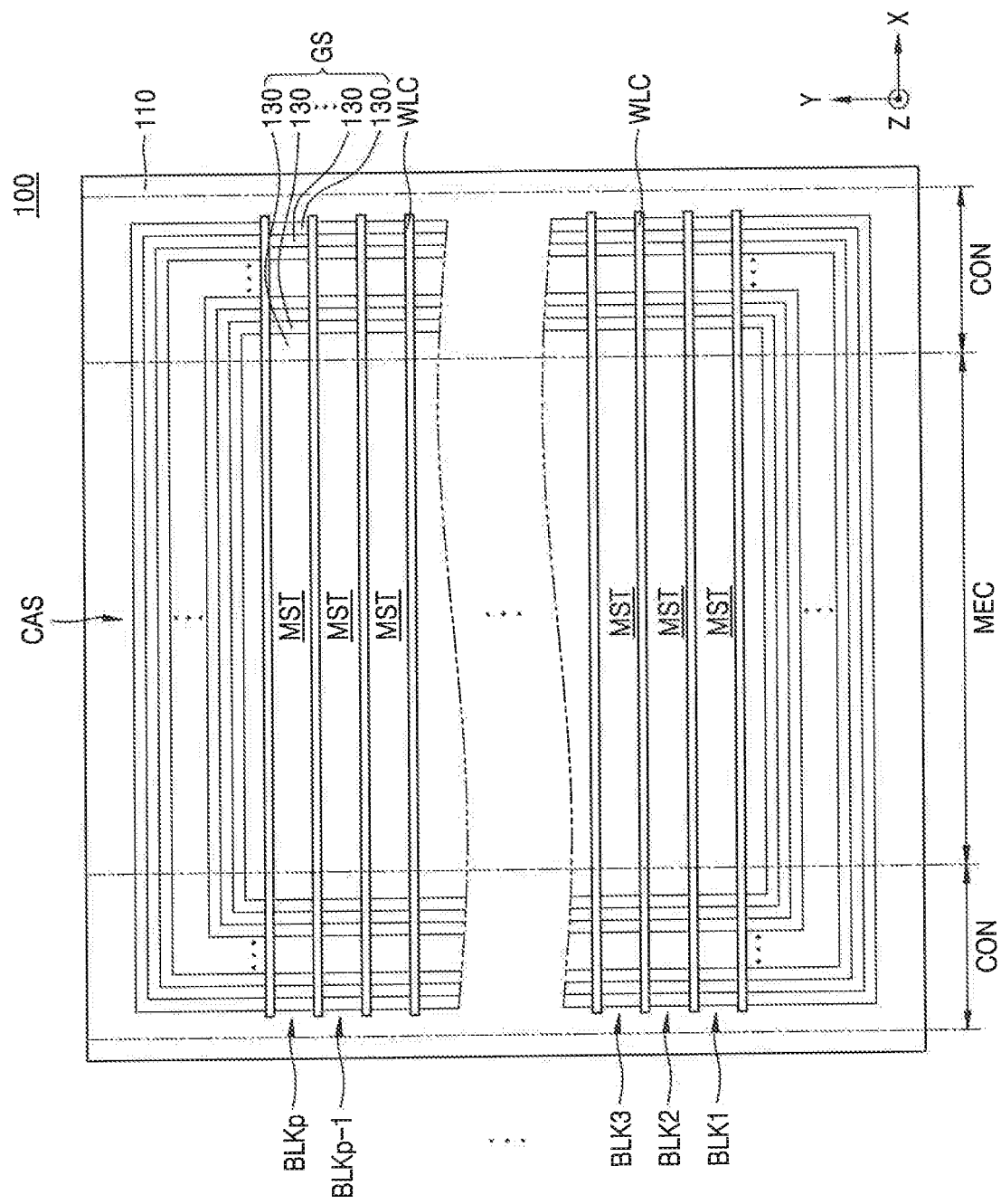
FIG. 4 is a schematic plan view of a partial region of a semiconductor device according to an exemplary embodiment of the present inventive concept.

FIG. 4 is a schematic plan view of a partial region of a semiconductor device 100 according to an exemplary embodiment of the present inventive concept.

Referring to FIG. 4, a cell array structure CAS of the semiconductor device 100 may include a substrate 110 and a plurality of memory cell blocks BLK1, BLK2, . . . , BLKp−1, BLKp disposed on the substrate 110.

The peripheral circuit 30 described above with reference to FIG. 1 may be disposed below the substrate 110 or in another region of the substrate 110. In an exemplary embodiment of the present inventive concept, the memory cell blocks BLK1, BLK2, . . . , BLKp−1, BLKp may overlap the peripheral circuit structure (PCS) (refer to FIG. 2) in a vertical direction (e.g., the Z direction) with the substrate 110 therebetween.

The cell array structure CAS may include a memory cell region MEC and connection regions CON disposed on two opposing sides of the memory cell region MEC in a first horizontal direction (e.g., an X direction). The memory cell blocks BLK1, BLK2, . . . , BLKp−1, BLKp may each include a memory stack structure MST extending in the first horizontal direction (e.g., the X direction) across the memory cell region MEC and the connection regions CON. The memory stack structure MST may include a plurality of gate lines 130 stacked on each other to overlap each other in the vertical direction (e.g., the Z direction) in the memory cell region MEC and the connection regions CON on the substrate 110. In each of the memory stack structures MST, the gate lines 130 may form a gate stack GS. In each of the memory stack structures MST, the gate lines 130 may form the ground select line GSL, the word lines WL, and the string select line SSL illustrated in FIG. 3. The memory stack structures MST may include a plurality of memory stacks disposed at different vertical levels in the vertical direction (e.g., the Z direction) and overlapping each other in the vertical direction (e.g., the Z direction). Each of the memory stacks may include a plurality of gate lines 130 overlapping each other in the vertical direction (e.g., the Z direction). In an exemplary embodiment of the present inventive concept, each of the memory stacks may include 48, 64, or 96 gate lines 130 stacked on each other to overlap each other in the vertical direction (e.g., the Z direction), but present inventive concept is not limited thereto.

In an exemplary embodiment of the present inventive concept, an area of the gate lines 130, which are included in the memory stack structures MST, on an X-Y plane may gradually decrease as a distance away from the substrate 110 increases. A central portion of each of the gate lines 130 overlapping each other in the vertical direction (e.g., the Z direction) may form the memory cell region MEC, and an edge portion of each of the gate lines 130 may form the connection region CON.

A plurality of word line cut structures WLC that extend in the first horizontal direction (e.g., the X direction) in the memory cell region MEC and the connection region CON may be disposed on the substrate 110. The word line cut structures WLC may be disposed to be spaced apart from each other in a second horizontal direction (e.g., a Y direction). The memory cell blocks BLK1, BLK2, ..., BLKp-1, BLKp may be disposed between the word line cut structures WLC, respectively.

Figure 5:
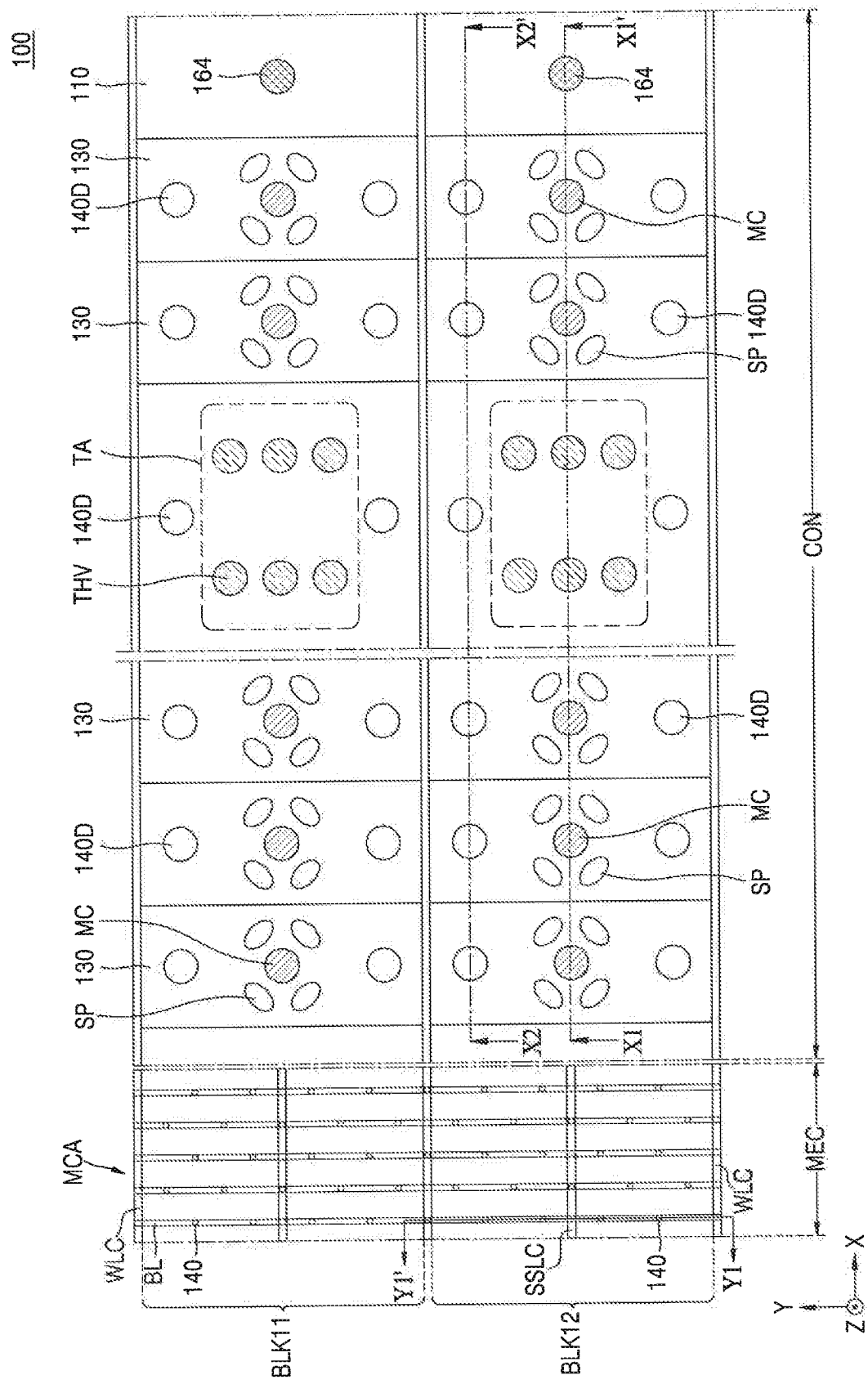
FIG. 5 is a schematic plan view of some components of a memory cell block included in a semiconductor device according to an exemplary embodiment of the present inventive concept.
Figure 6A:
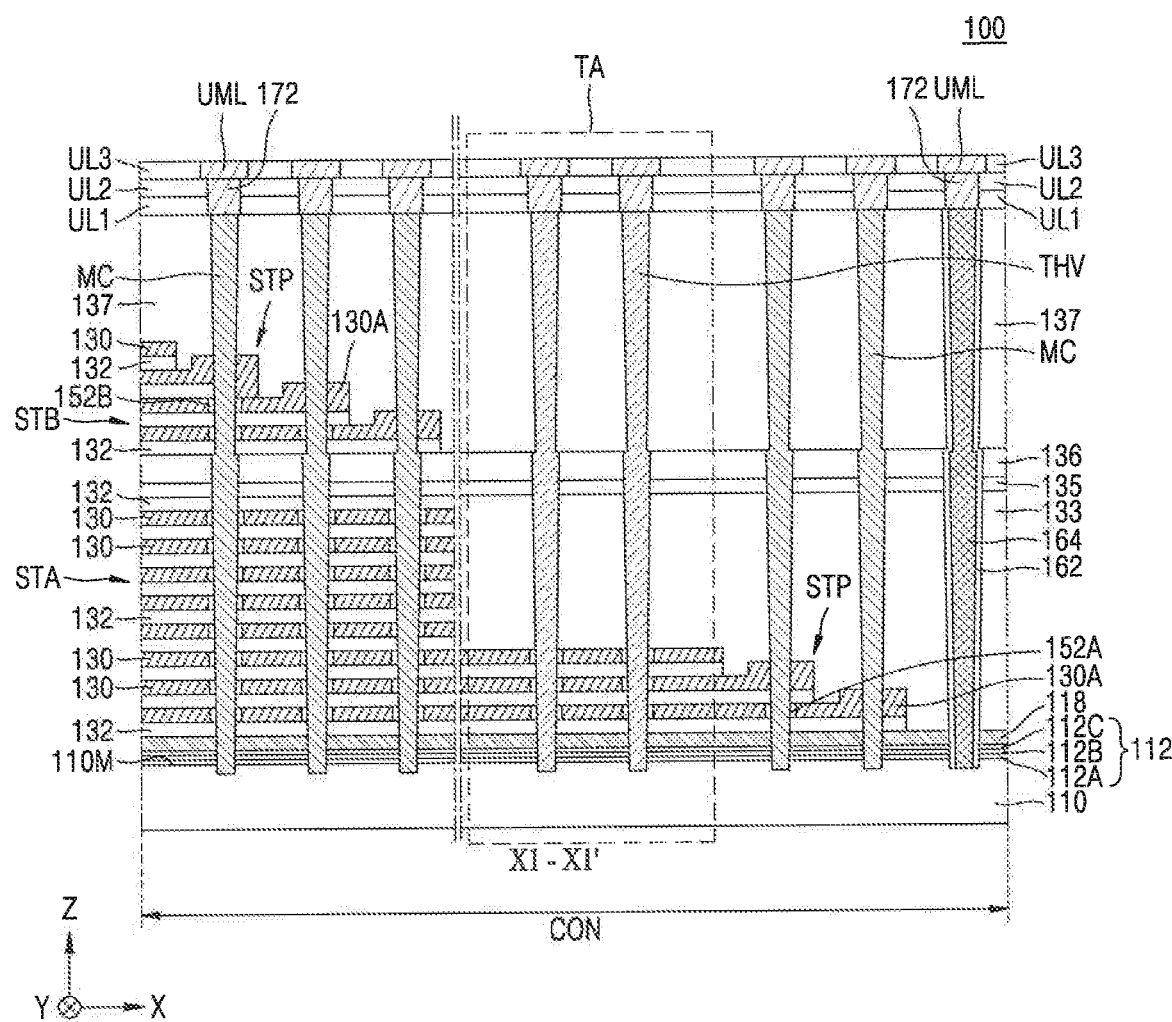
FIG. 6A is a cross-sectional view taken along line X1-X1' of FIG. 5.
Figure 6B:
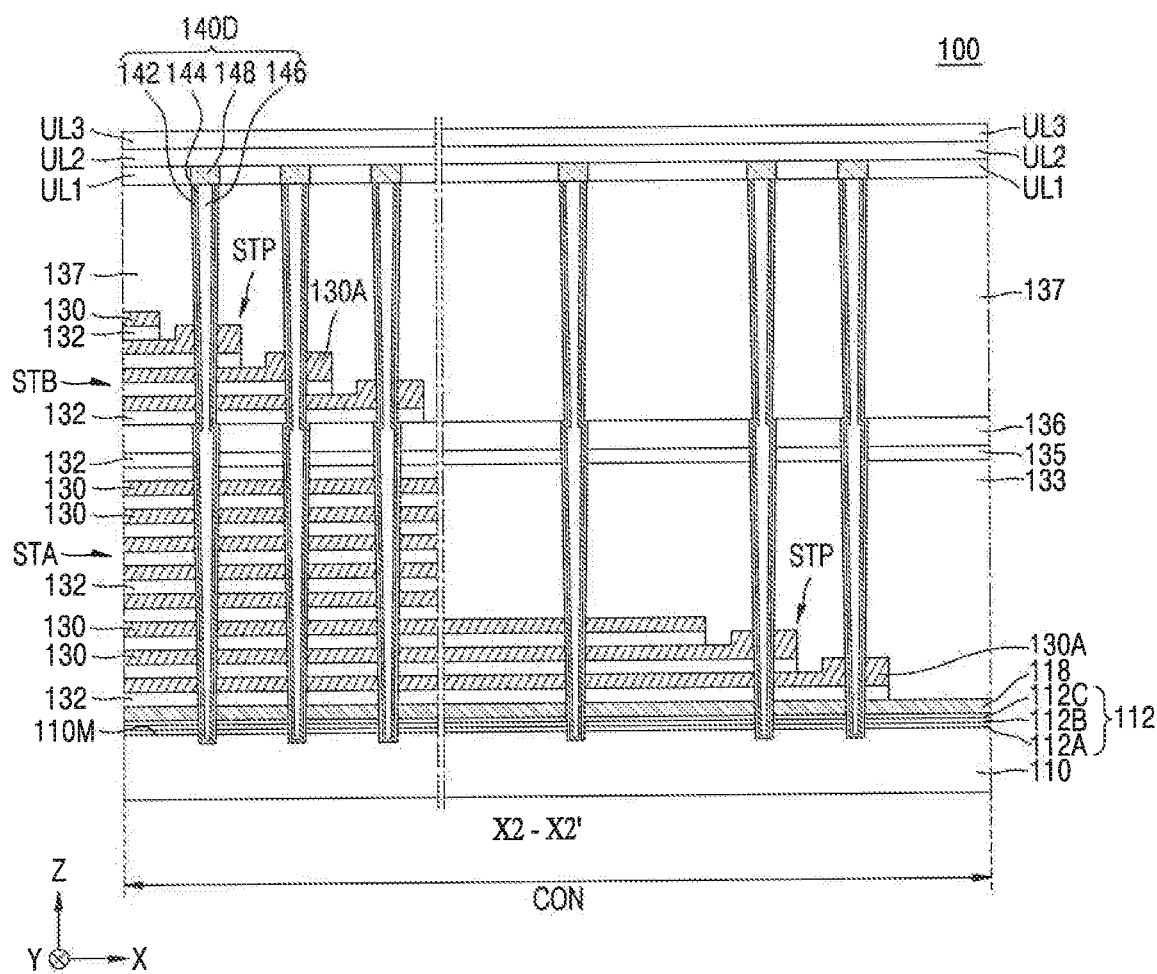
FIG. 6B is a cross-sectional view taken along line X2-X2' of FIG. 5.
Figure 6C:
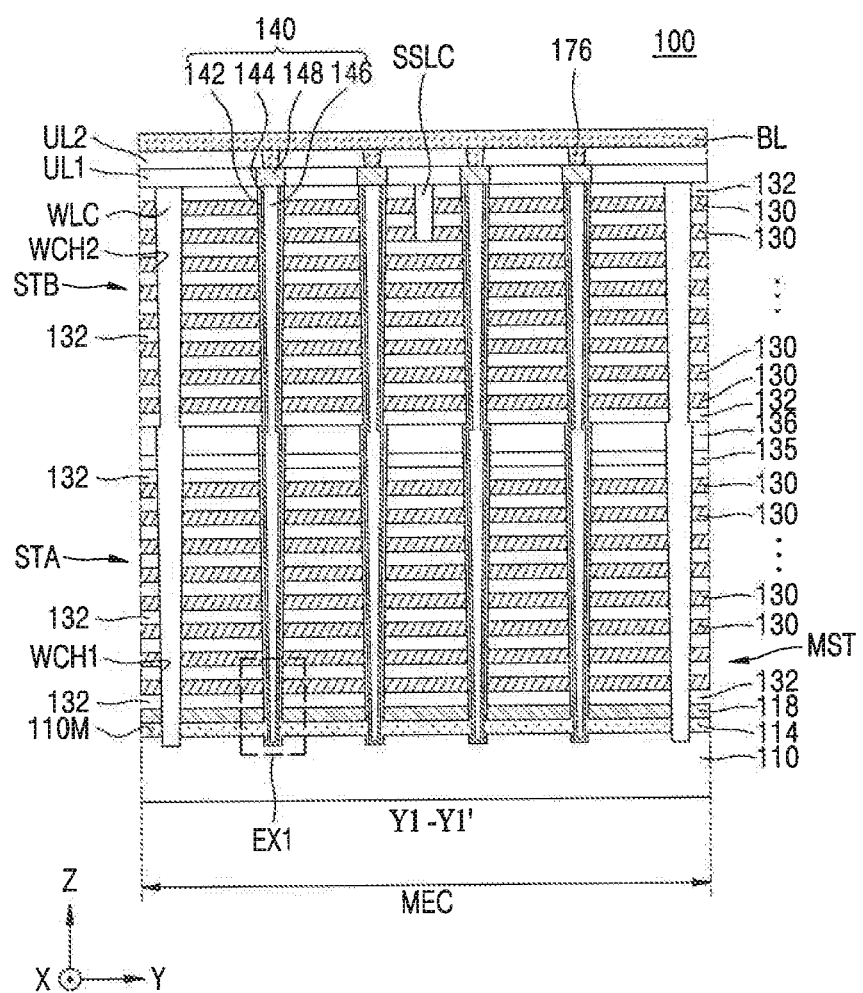
FIG. 6C is an enlarged cross-sectional view taken along line Y1-Y1' of FIG. 5.
Figure 6D:
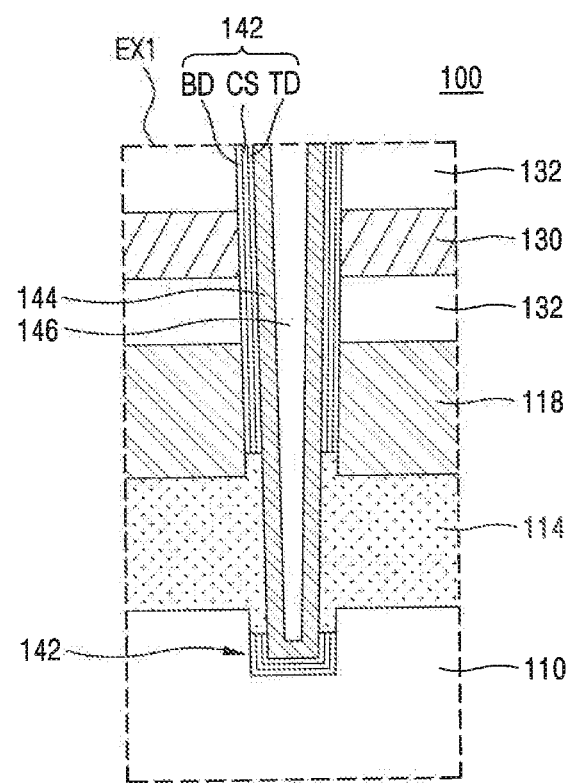
FIG. 6D is an enlarged cross-sectional view of some components included in a region indicated by "EX1" in FIG. 6C.

FIGS. 5 and 6A to 6D are views illustrating in more detail the semiconductor device 100 according to an exemplary embodiment of the present inventive concept. In an exemplary embodiment of the present inventive concept, FIG. 5 is a schematic plan view of some components of the memory cell blocks BLK11 and BLK12. FIG. 6A is a cross-sectional view taken along line X1-X1' of FIG. 5. FIG. 6B is a cross-sectional view taken along line X2-X2' of FIG. 5. FIG. 6C is an enlarged cross-sectional view taken along line Y1-Y1' of FIG. 5. FIG. 6D is an enlarged cross-sectional view of some components included in a region indicated by "EX1" in FIG. 6C. The memory cell blocks BLK11 and BLK12 illustrated in FIG. 5 may form any one of the memory cell blocks BLK1, BLK2, BLK3, ..., BLKp-1, BLKp illustrated in FIG. 4, respectively.

Referring to FIGS. 5 and 6A to 6D, the semiconductor device 100 may include a substrate 110 including the memory cell region MEC and the connection region CON, a first stack STA disposed at a first vertical level on the substrate 110, and a second stack STB disposed at a second vertical level higher than the first vertical level on the substrate 110. As used herein, a term "vertical level" refers to a distance from an upper surface of the substrate 110 in the vertical direction (e.g., the Z direction or a -Z direction).

The first stack STA and the second stack STB may each include the gate lines 130 and a stepped connection portion STP. The gate lines 130 overlap each other in the vertical direction (e.g., the Z direction) in the memory cell region MEC, and the stepped connection portion STP is disposed in the connection region CON and has a plurality of conductive pad portions 130A integrally connected to the gate lines 130. For example, the conductive pad portions 130A may be formed in the gate lines 130. The first stack STA and the second stack STB may form the cell array structure CAS illustrated in FIG. 4. In the present inventive concept, the gate line 130 included in the first stack STA may be referred to as a "lower gate line". Further, the conductive pad portion 130A included in the first stack STA may be referred to as a "lower conductive pad portion," and the stepped connection portion STP included in the first stack STA may be referred to as a "lower stepped connection portion." In addition, the gate line 130 included in the second stack STB may be referred to as an "upper gate line," and the conductive pad portion 130A included in the second stack STB may be referred to as an "upper conductive pad portion". The stepped connection portion STP included in the second stack STB may be referred to as an "upper stepped connection portion."

As illustrated in FIGS. 6A and 6B, an insulating plate 112 and a second conductive plate 118 may be disposed on the substrate 110 in the connection region CON, and as illustrated in FIG. 6C. A first conductive plate 114 and the second conductive plate 118 may be disposed on the substrate 110 in the memory cell region MEC. The memory stack structure MST including the first stack STA and the second stack STB may be disposed on the second conductive plate 118 in the memory cell region MEC and the connection region CON.

In an exemplary embodiment of the present inventive concept, the first conductive plate 114 and the second conductive plate 118 in the memory cell region MEC may function as the common source line CSL described above with reference to FIG. 3. The first conductive plate 114 and the second conductive plate 118 may function as a source region supplying current to vertical memory cells included in the cell array structure CAS.

In an exemplary embodiment of the present inventive concept, the substrate 110 may include a semiconductor material such as polysilicon. For example, each of the first conductive plate 114 and the second conductive plate 118 may include a doped polysilicon film, a metal film, or a combination thereof. The metal film may include, for example, tungsten (W), but the present inventive concept is not limited thereto. In the memory stack structure MST, the gate lines 130 extending parallel to each other in the horizontal direction and overlapping each other in the vertical direction (e.g., the Z direction) may form the gate stack GS (refer to FIG. 4). For example, each of the gate lines 130 may include a metal, a metal silicide, a semiconductor doped with an impurity, or a combination thereof. For example, each of the gate lines 130 may include a metal such as tungsten, nickel, cobalt, or tantalum, metal silicide such as tungsten silicide, nickel silicide, cobalt silicide, tantalum silicide, doped polysilicon, or a combination thereof.

An insulating film 132 may be between the second conductive plate 118 and the gate lines 130 and between the gate lines 130. In each of the first stack STA and the second stack STB, the uppermost gate line 130, among the gate lines 130, may be covered with the insulating film 132. The insulating film 132 may include, for example, silicon oxide.

As illustrated in FIGS. 6A and 6B, in the first stack STA in the connection region CON, an edge portion of each of the gate lines 130, the conductive pad portions 130A, and a plurality of insulating films 132 may be covered with the lower insulating block 133. The lower insulating block 133 may be in contact with each of the gate lines 130, the conductive pad portions 130A, and the insulating films 132 included in the first stack STA. The lower insulating block 133 may have a surface, which faces the stepped connection portion STP included in the first stack STA, and an upper surface extending in a direction parallel to a main surface 110M (e.g., an upper surface) of the substrate 110. For example, the upper surface of the lower insulating block 133 may be substantially flat.

In the second stack STB in the connection region CON, an edge portion of each of the gate lines 130, the conductive pad portions 130A, and the insulating films 132 may be covered with an upper insulating block 137. The upper insulating block 137 may be in contact with the gate lines 130, the conductive pad portions 130A, and the insulating films 132 included in the second stack STB. The upper insulating block 137 may have a surface, which faces the stepped connection portion STP included in the second stack STB, and an upper surface extending in a direction parallel to the main surface 110M of the substrate 110. For example, the upper surface of the upper insulating block 137 may be substantially flat.

Each of the lower insulating block 133 and the upper insulating block 137 may include a doped silicon oxide film. In an exemplary embodiment of the present inventive concept, the lower insulating block 133 and the upper insulating block 137 may include a silicon oxide film doped with a dopant element selected from among metalloid elements and non-metal elements and having an atomic weight within a range of 5 to 15. For example, the dopant element may include a metalloid element or a non-metal element. For example, the lower insulating block 133 and the upper insulating block 137 may each include a silicon oxide film doped with one dopant element including one of phosphorus (P), nitrogen (N), boron (B), fluorine (F), and/or carbon (C).

Intermediate insulating films 135 and 136 may be disposed between the first vertical level at which the first stack STA is disposed and the second vertical level at which the second stack STB is disposed. The intermediate insulating films 135 and 136 may include a first intermediate insulating film 135 and a second intermediate insulating film 136 sequentially stacked on the first stack STA. Each of the first intermediate insulating film 135 and the second intermediate insulating film 136 may include a doped silicon oxide film. In an exemplary embodiment of the present inventive concept, the first intermediate insulating film 135 and the second intermediate insulating film 136 may include a silicon oxide film doped with a dopant element selected from among metalloid elements and non-metal elements and having an atomic weight within a range of 5 to 15. For example, each of the first intermediate insulating film 135 and the second intermediate insulating film 136 may include a silicon oxide film doped with one dopant element selected from among phosphorus (P), nitrogen (N), boron (B), fluorine (F), and carbon (C).

When the lower insulating block 133, the upper insulating block 137, the first intermediate insulating film 135, and the second intermediate insulating film 136 each include a doped silicon oxide film, a doping concentration of the dopant element in each thereof may be 0.1 atomic % to 2 atomic %, and a doping concentration of the dopant element in each thereof may be substantially constant according to a position in each of the lower insulating block 133, the upper insulating block 137, the first intermediate insulating film 135, and the second intermediate insulating film 136.

In an exemplary embodiment of the present inventive concept, the lower insulating block 133, the upper insulating block 137, the first intermediate insulating film 135, and the second intermediate insulating film 136 include silicon oxide films including the same dopant element, and in each of the lower insulating block 133, the upper insulating block 137, the first intermediate insulating film 135, and the second intermediate insulating film 136, the doping concentration of the dopant element may be the same.

In an exemplary embodiment of the present inventive concept, each of the lower insulating block 133, the upper insulating block 137, the first intermediate insulating film 135, and the second intermediate insulating film 136 might not include carbon (C) as a dopant element. In an exemplary embodiment of the present inventive concept, each of the lower insulating block 133, the upper insulating block 137, the first intermediate insulating film 135, and the second intermediate insulating film 136 may include a doped silicon oxide film, and during a deposition process to form the lower insulating block 133, the upper insulating block 137, the first intermediate insulating film 135, and the second intermediate insulating film 136, a silicon compound containing carbon might not be used as a silicon precursor. For example, monosilane ($SiH_4$) or disilane ($Si_2H_6$) may be used as a silicon precursor during the deposition process to form each of the lower insulating block 133, the upper insulating block 137, the first intermediate insulating film 135, and the second intermediate insulating film 136. The lower insulating block 133, the upper insulating block 137, the first intermediate insulating film 135, and the second intermediate insulating film 136 obtained in this manner might not include a carbon element or carbon impurities derived from a silicon precursor containing carbon. As illustrated in FIGS. 5 and 6C, the word line cut structures WLC may extend in the first horizontal direction (e.g., the X direction) on the substrate 110 in the memory cell region MEC and the connection region CON. A width of each of the gate lines 130 included in the memory cell blocks BLK11 and BLK12 in the second horizontal direction (e.g., the Y direction) may be limited by the word line cut structures WLC.

Each of the word line cut structures WLC may include an insulating structure. In exemplary embodiment of the present inventive concept, the insulating structure may include silicon oxide, silicon nitride, silicon oxynitride, or a low-k material. For example, the insulating structure may include a silicon oxide film, a silicon nitride film, an SiON film, a SiOCN film, a SiCN film, or a combination thereof. In an exemplary embodiment of the present inventive concept, at least a portion of the insulating structure may include an air gap. As used herein, a term "air" refers to the atmosphere or gases that may be present during a manufacturing process.

The gate lines 130 may be stacked to overlap each other in the vertical direction (e.g., the Z direction) on the second conductive plate 118 and may be between two adjacent word line cut structures WLC. The gate lines 130 may include the ground select line GSL, the word lines WL, and the string select line SSL described above with reference to FIG. 3.

Among the gate lines 130, two upper gate lines 130 may be separated from each other in the second horizontal direction (e.g., the Y direction) with the string select line cut structure SSLC therebetween. Each of the two gate lines 130 separated from each other with the string select line cut structure SSLC therebetween may constitute the string select line SSL described above with reference to FIG. 3. FIG. 6C illustrates a case in which one string select line cut structure SSLC is formed in one gate stack GS (refer to FIG. 4) defined by two adjacent string select line cut structures SSLC, but the present inventive concept is not limited to that illustrated in FIG. 6C. For example, at least two string select line cut structures SSLC may be formed in one gate stack GS. The string select line cut structure SSLC may be filled with an insulating film. In an exemplary embodiment of the present inventive concept, the string select line cut structure SSLC may include an insulating film including an oxide film, a nitride film, or a combination thereof. In an exemplary embodiment of the present inventive concept, at least a portion of the string select line cut structure SSLC may include an air gap.

As illustrated in FIG. 6C, in the memory cell region MEC, a plurality of channel structures 140 may pass through the gate lines 130, the insulating films 132, the first intermediate insulating film 135, the second intermediate insulating film 136, the second conductive plate 118, and the first conductive plate 114 and extend in the vertical direction (e.g., the Z direction). The channel structures 140 may be arranged to be spaced apart from each other with a certain interval therebetween in the first horizontal direction (e.g., the X direction) and the second horizontal direction (e.g., the Y direction). Each of the channel structures 140 may include a gate dielectric film 142, a channel region 144, a buried insulating film 146, and a drain region 148.

As illustrated in FIG. 6D, the gate dielectric film 142 may include a tunneling dielectric film TD, a charge storage film CS, and a blocking dielectric film BD sequentially formed from the channel region 144 toward the gate line 130. Relative thicknesses of the tunneling dielectric film TD, the charge storage film CS, and the blocking dielectric film BD are not limited to those illustrated in FIG. 6D and may be variously modified.

The tunneling dielectric film TD may include, for example, silicon oxide, hafnium oxide, aluminum oxide, zirconium oxide, tantalum oxide, or the like. The charge storage film CS may be a region in which electrons passing through the tunneling dielectric film TD from the channel region 144 may be stored, and may include, for example, silicon nitride, boron nitride, silicon boron nitride, or polysilicon doped with impurities. The blocking dielectric film BD may include, for example, silicon oxide, silicon nitride, or metal oxide having a permittivity higher than that of silicon oxide. The metal oxide may include, for example, hafnium oxide, aluminum oxide, zirconium oxide, tantalum oxide, or a combination thereof.

As illustrated in FIGS. 6C and 6D, the first conductive plate 114 may pass through a partial region of the gate dielectric film 142 in the horizontal direction (e.g., the X direction and/or Y direction) to contact the channel region 144. A thickness of a portion of the first conductive plate 114 that vertically overlaps the gate dielectric film 142 (e.g., a size in the Z direction) may be greater than a thickness of a portion of the first conductive plate 114 that vertically overlaps the second conductive plate 118 (e.g., a size in the Z direction). The gate dielectric film 142 may include a first portion and a second portion. The first portion covers a sidewall of the channel region 144 at a level higher than the first conductive plate 114, and the second portion covering a bottom surface of the channel region 144 at a level lower than the first conductive plate 114. The channel region 144 may be spaced apart from the substrate 110 with the lowest portion of the gate dielectric film 142 therebetween. A sidewall of the channel region 144 may be in contact with the first conductive plate 114 and may be electrically connected to the first conductive plate 114.

As illustrated in FIGS. 6C and 6D, the channel region 144 may have a cylindrical shape; however, the present inventive concept is not limited thereto. The channel region 144 may include doped polysilicon or undoped polysilicon.

The buried insulating film 146 may fill an internal space of the channel region 144. For example, the buried insulating film 146 may be disposed on inner sidewalls of the channel region 144, and the channel region 144 may be between the gate dielectric film 142 and the buried insulating film 146. The buried insulating film 146 may include an insulating material. For example, the buried insulating film 146 may include silicon oxide, silicon nitride, silicon oxynitride, or a combination thereof. In an exemplary embodiment of the present inventive concept, the buried insulating film 146 may be omitted. In this case, the channel region 144 may have a pillar structure without an internal hollow space.

In the memory cell region MEC, a top surface of each of the string select line cut structure SSLC, the word line cut structure WLC, the gate dielectric film 142, the channel region 144, and the buried insulating film 146 may extend from substantially the same vertical level. The drain region 148 may include a doped polysilicon film. A plurality of drain regions 148 may be insulated from each other by a first upper insulating film UL1 covering the second stack STB.

A second upper insulating film UL2 and a third upper insulating film UL3 may be sequentially formed on the channel structures 140 and the first upper insulating film UL1 in the memory cell region MEC and the connection region CON. Each of the first upper insulating film UL1, the second upper insulating film UL2, and the third upper insulating film UL3 may include, for example, an oxide film, a nitride film, or a combination thereof.

As illustrated in FIGS. 5 and 6C, the bit lines BL may be disposed on the second upper insulating film UL2 in the memory cell region MEC of the memory stack structure MST. The bit lines BL may extend parallel to each other in the second horizontal direction (e.g., the Y direction). For example, a space between each of the bit lines BL may be filled with the third upper insulating film UL3. The drain region 148 of each of the channel structures 140 may be connected to the bit line BL through a contact plug 176 passing through the second upper insulating film UL2.

As illustrated in FIGS. 6A and 6B, in the connection region CON, an insulating plate 112 and a second conductive plate 118 may be sequentially stacked on the substrate 110. The insulating plate 112 may have a multilayer structure including a first insulating film 112A, a second insulating film 112B, and a third insulating film 112C sequentially stacked on the substrate 110. In an exemplary embodiment of the present inventive concept, the first insulating film 112A and the third insulating film 112C may include silicon oxide film, and the second insulating film 112B may include a silicon nitride film.

In the connection region CON, the conductive pad portion 130A, of a gate line 130A, having a thickness in the vertical direction (e.g., the Z direction) greater than that of another portion of the gate line 130 may be formed at one end of the gate line 130 included in the first stack STA and the second stack STB. The conductive pad portion 130A may be integrally connected to an edge portion of the gate line 130 that is farthest from the memory cell region MEC. FIGS. 6A and 6B show only the conductive pad portion 130A connected to one end of some of the gate lines 130, but other gate lines 130 may be integrally connected to the conductive pad portion 130A in other portions of FIGS. 6A and 6B that are not illustrated.

As illustrated in FIGS. 5 and 6A, a plurality of memory cell contacts MC and a plurality of insulating support structures SP may be disposed in the connection region CON. Each of the memory cell contacts MC may be electrically connected to one conductive pad portion 130A of the conductive pad portions 130A included in the first stack STA and the second stack STB. Each of the insulating support structures SP may vertically pass through the first stack STA and the second stack SIB to support the first stack STA and the second stack STB in the connection region CON. In an exemplary embodiment of the present inventive concept, each of the memory cell contacts MC may form with the insulating support structures SP a plug structure.

Some memory cell contacts MC of the memory cell contacts MC may be spaced apart from the stepped connection portion STP included in the second stack STB in the horizontal direction (e.g., the X direction in FIG. 6A), while other memory cell contacts MC may pass through the stepped connection portion STP, which is included in the second stack STB, and the upper insulating block 137 in the vertical direction (e.g., the Z direction). Some of the memory cell contacts MC may pass through the stepped connection portion STP included in the first stack STA, the lower insulating block 133, the first intermediate insulating film 135, the second intermediate insulating film 136, and the upper insulating block 137 in the vertical direction (e.g., the Z direction) and may be electrically connected to one conductive pad portion 130A of the conductive pad portions 130A included in the first stack STA.

Other memory cell contacts MC among the memory cell contacts MC may pass through the stepped connection portion STP included in the second stack STB in the vertical direction (e.g., the Z direction) and may be electrically connected to one conductive pad portion 130A among the conductive pad portions 130A included in the second stack STB.

Some of the memory cell contacts MC may include a portion surrounded by the lower insulating block 133, a portion surrounded by the intermediate insulating films 135 and 136, and a portion surrounded by the upper insulating block 137. Other memory cell contacts MC among the memory cell contacts MC may be horizontally spaced apart from the lower insulating block 133 and may include a portion surrounded by the intermediate insulating films 135 and 136 and a portion surrounded by the upper insulating block 137.

As illustrated in FIG. 6A, each of the memory cell contacts MC may pass through at least a portion of the gate lines 130 and the insulating films 132. Each of the memory cell contacts MC may be disposed in a hole passing through at least one of the gate lines 130.

Similar to the memory cell contacts MC, each of the insulating support structures SP (refer to FIG. 5) may pass through at least a portion of the gate lines 130 and the insulating films 132. Each of the insulating support structures SP may be disposed in a hole passing through at least one of the gate lines 130.

Each of the memory cell contacts MC may be connected to one gate line 130 among the gate lines 130 and might not be connected to other gate lines 130 except for the one it is already connected to. Each of the memory cell contacts MC may be in contact with the conductive pad portion 130A of one gate line 130 among the gate lines 130, and may be connected to the one gate line through the conductive pad portion 130A.

In an exemplary embodiment of the present inventive concept, each of the memory cell contacts MC may include tungsten, titanium, tantalum, copper, aluminum, titanium nitride, tantalum nitride, tungsten nitride, or a combination thereof, but the present inventive concept is not limited thereto. For example, each of the insulating support structures SP may include silicon oxide, but the present inventive concept is not limited thereto.

Each of the memory cell contacts MC may be horizontally spaced apart from other gate lines 130 except for the selected one gate line 130, to which the memory cell contact MC is connected to. In the first stack STA, a first insulating ring 152A may be disposed between each of the memory cell contacts MC and another gate line 130 that is not electrically connected to the memory cell contacts MC. In the second stack STB, a second insulating ring 152B may be disposed between each of the memory cell contacts MC and another gate line 130 that is not electrically connected to the memory cell contacts MC. In an exemplary embodiment of the present inventive concept, the first insulating ring 152A and the second insulating ring 152B may include a silicon oxide film, but the present inventive concept is not limited thereto.

As illustrated in FIGS. 5 and 6B, a plurality of dummy channel structures 140D may be disposed in the connection region CON. The dummy channel structures 140D may include dummy channel structures 140D passing through the stepped connection portion STP included in the first stack STA in the vertical direction (e.g., the Z direction) and the dummy channel structures 140D passing through the stepped connection portion STP respectively included in the first stack STA and the second stack STB and the intermediate insulating films 135 and 136 in the vertical direction (the Z direction). FIG. 6B illustrates a case in which the dummy channel structures 140D pass through the conductive pad portion 130A included in the stepped connection portion STP in the vertical direction (e.g., the Z direction), but the present inventive concept is not limited to what is illustrated in FIG. 6B. For example, at least a portion of the dummy channel structures 140D may pass through a portion of the gate line 130 spaced apart in a horizontal direction from the conductive pad portion 130A in the vertical direction (e.g., the Z direction) in the connection region CON. In an exemplary embodiment of the present inventive concept, each of the dummy channel structures 140D may be referred to as a plug structure.

Some of the dummy channel structures 140D among the dummy channel structures 140D may pass through the stepped connection portion STP included in the first stack STA, the lower insulating block 133, the first intermediate insulating film 135, the second intermediate insulating film 136, and the upper insulating block 137 in the vertical direction (e.g., the Z direction). The other dummy channel structures 140D among the dummy channel structures 140D may pass through the stepped connection portion STP included in the first stack STA, the first intermediate insulating film 135, and the second intermediate insulating film 136, the stepped connection portion STP included in the second stack STB, and the upper insulating block 137 in the vertical direction (e.g., the Z direction).

In the connection region CON, the dummy channel structures 140D may be arranged to be spaced apart from each other with a certain interval therebetween in the first horizontal direction (e.g., the X direction) and the second horizontal direction (e.g., the Y direction). Each of the dummy channel structures 140D may include a gate dielectric film 142, a channel region 144, a buried insulating film 146, and a drain region 148, similar to the channel structure 140 disposed in the memory cell region MEC. However, a planar size of each of the dummy channel structures 140D may be larger than a planar size of the channel structures 140; however, the present inventive concept is not limited thereto. The number and arrangement shape of the dummy channel structures 140D illustrated in FIG. 5 are only an example, and the present inventive concept is not limited thereto. In the connection region CON, the dummy channel structures 140D may be disposed in various arrangements at various positions selected in the memory stack structure MST.

As illustrated in FIGS. 6A and 6B, the upper insulating block 137 in the connection region CON may be covered with a first upper insulating film UL1. In the connection region CON, the dummy channel structures 140D may be covered with a second upper insulating film UL2.

As illustrated in FIGS. 5 and 6A, a conductive plate contact 164 may be disposed in the connection region CON. The conductive plate contact 164 may pass through the upper insulating block 137, the intermediate insulating films 135 and 136, the lower insulating block 133, the second conductive plate 118, and the insulating plate 112 and extend in the vertical direction (e.g., the Z direction) to the substrate 110. A sidewall of the conductive plate contact 164 may be covered with an insulating spacer 162. The insulating spacer 162 may include a silicon oxide film.

Each of the memory cell contacts MC and the conductive plate contact 164 may be connected to a corresponding upper wiring layer UML of a plurality of upper wiring layers UML through a contact plug 172 passing through the first upper insulating film UL1 and the second upper insulating film UL2. The upper wiring layers UML may be disposed at the same vertical level as that of the bit lines BL disposed in the memory cell region MEC. A space between each of the upper wiring layers UML may be filled with a third upper insulating film UL3.

A topmost surface of each of the memory cell contacts MC, the insulating support structures SP, and the conductive plate contact 164 may be at substantially the same vertical level. In an exemplary embodiment of the present inventive concept, the conductive plate contacts 164, the contact plugs 172, the contact plugs 176, the upper wiring layers UML, and the bit lines BL may each include tungsten, titanium, tantalum, copper, aluminum, titanium nitride, tantalum nitride, tungsten nitride, or a combination thereof, but the present inventive concept not limited thereto.

As illustrated in FIG. 6A, the memory cell blocks BLK11 and BLK12 of the semiconductor device 100 may include a through-electrode region TA including a plurality of through-electrodes THV arranged in the connection region CON. In an exemplary embodiment of the present inventive concept, each of the through-electrodes THV may be referred to as a plug structure.

Each of the through-electrodes THV may pass through at least one of the stepped connection portion STP included in the first stack STA and the stepped connection portion STP included in the second stack STB in the vertical direction (e.g., the Z direction). The through-electrodes THV may be configured not to be electrically connected to the gate line 130 and the conductive pad portion 130A included in the first stack STA and the second stack STB, respectively.

As illustrated in FIG. 6A, some of the through-electrodes THV selected from among the through-electrodes THV may include a portion surrounded by the lower insulating block 133, a portion surrounded by the intermediate insulating films 135 and 136, and a portion surrounded by the upper insulating block 137. In the connection region CON, a top surface of each of the memory cell contacts MC, the through-electrodes TI-IV, and the conductive plate contact 164 may be at substantially the same vertical level.

Each of the through-electrodes THV may pass through at least a portion of the gate lines 130 and the insulating films 132. Each of the through-electrodes THV may be disposed in a hole passing through at least one of the gate lines 130. Each of the through-electrodes THV may not be connected to the gate line 130. The through-electrodes THV may be horizontally spaced apart from the gate line 130. Each of the through-electrodes THV may include, for example, tungsten, titanium, tantalum, copper, aluminum, titanium nitride, tantalum nitride, tungsten nitride, or a combination thereof, but the present inventive concept is not limited thereto.

In the first stack STA, the first insulating ring 152A may be disposed between the through-electrodes THV and the gate line 130 adjacent that is adjacent to the gate line 130. When the through-electrodes THV pass through the second stack STB, the second insulating ring 152B may also be disposed between the second through-electrodes THV2 and the gate line 130 adjacent to the gate line 130 in the second stack STB.

In the semiconductor device 100 described above with reference to FIGS. 4 to 6D, insulating structures occupying a relatively large volume in the connection region CON of the cell array structure CAS, for example, the lower insulating block 133 and the upper insulating block 137 may include a silicon oxide film doped with a dopant element selected from among metalloid elements and non-metal elements and having an atomic weight within a range of 5 to 15. In a case, in which the number of stacks of the gate lines 130 constituting the memory stack structure MST is increased to increase the degree of integration of the semiconductor device 100 and in which the cell array structure CAS includes a plurality of stacks including the first stack STA and the second stack STB, a structure that includes at least one of the lower insulating block 133 and the upper insulating block 137 needs to be dry-etched to form a plurality of vertical holes having a relatively large aspect ratio. Even in this case, it is possible to prevent ion scattering occurring in a hole portion passing through the lower insulating block 133 or the upper insulating block 137 during the dry etching process, and accordingly, an occurrence of bowing may be effectively prevented.

In addition, in the semiconductor device 100 according to an exemplary embodiment of the present inventive concept, monosilane ($SiH_4$) or disilane ($Si_2H_6$), rather than a silicon precursor containing carbon as a silicon precursor, may be used during a deposition process of forming a silicon oxide film forming each of the lower insulating block 133, the upper insulating block 137, the first intermediate insulating film 135, and the second intermediate insulating film 136. Each of the lower insulating block 133, the upper insulating block 137, the first intermediate insulating film 135, and the second intermediate insulating film 136 obtained in this manner might not include a carbon element or carbon impurities derived from a silicon precursor containing carbon. In addition, when forming a plurality of vertical holes by etching the lower insulating block 133, the upper insulating block 137, the first intermediate insulating film 135, and the second intermediate insulating film 136 at a relatively low process temperature from about room temperature (e.g., a temperature of about 20° C. to about 28° C.) to about 100° C., a dry etching rate may be relatively high, so that productivity of a manufacturing process of the semiconductor device 100 may be increased.

In this regard, a silicon oxide film doped with a phosphorus (P) element may be formed as a doped silicon oxide film constituting each of the lower insulating block 133, the upper insulating block 137, the first intermediate insulating film 135, and the second intermediate insulating film 136 of the semiconductor device 100 according to an exemplary embodiment of the present inventive concept. In addition, dry etching rates of the doped silicon oxide film were compared when monosilane ($SiH_4$) was used as a silicon precursor and when tetraethyl orthosilicate (TEOS) was used as a silicon precursor for evaluation, and it was found that the dry etching rate of the doped silicon oxide film obtained when monosilane ($SiH_4$) was used as a silicon precursor was greater than the dry etching rate of the doped silicon oxide film when TEOS was used as a silicon precursor. In addition, it was found that the dry etching rate of the doped silicon oxide film is higher as a doping concentration of the dopant element in the doped silicon oxide film, which was obtained when monosilane ($SiH_4$) was used as a silicon precursor, is higher.

Therefore, in manufacturing the semiconductor device 100 according to an exemplary embodiment of the present inventive concept, when vertical holes having a relatively large aspect ratio are formed to form plug structures passing through at least one of the first stack STA, the second stack STB, the lower insulating block 133, and the upper insulating block 137, an occurrence of bowing in the vertical holes due to an ion scattering phenomenon may be suppressed even when various films having different etching characteristics under given etching conditions need to be etched, and accordingly, a spacing distance between the plug structures filling the vertical holes may be stably maintained. Accordingly, the manufacturing process of the semiconductor device 100 may be facilitated, productivity may be increased, and electrical characteristics and reliability of the semiconductor device 100 may be maintained.

Figure 7:
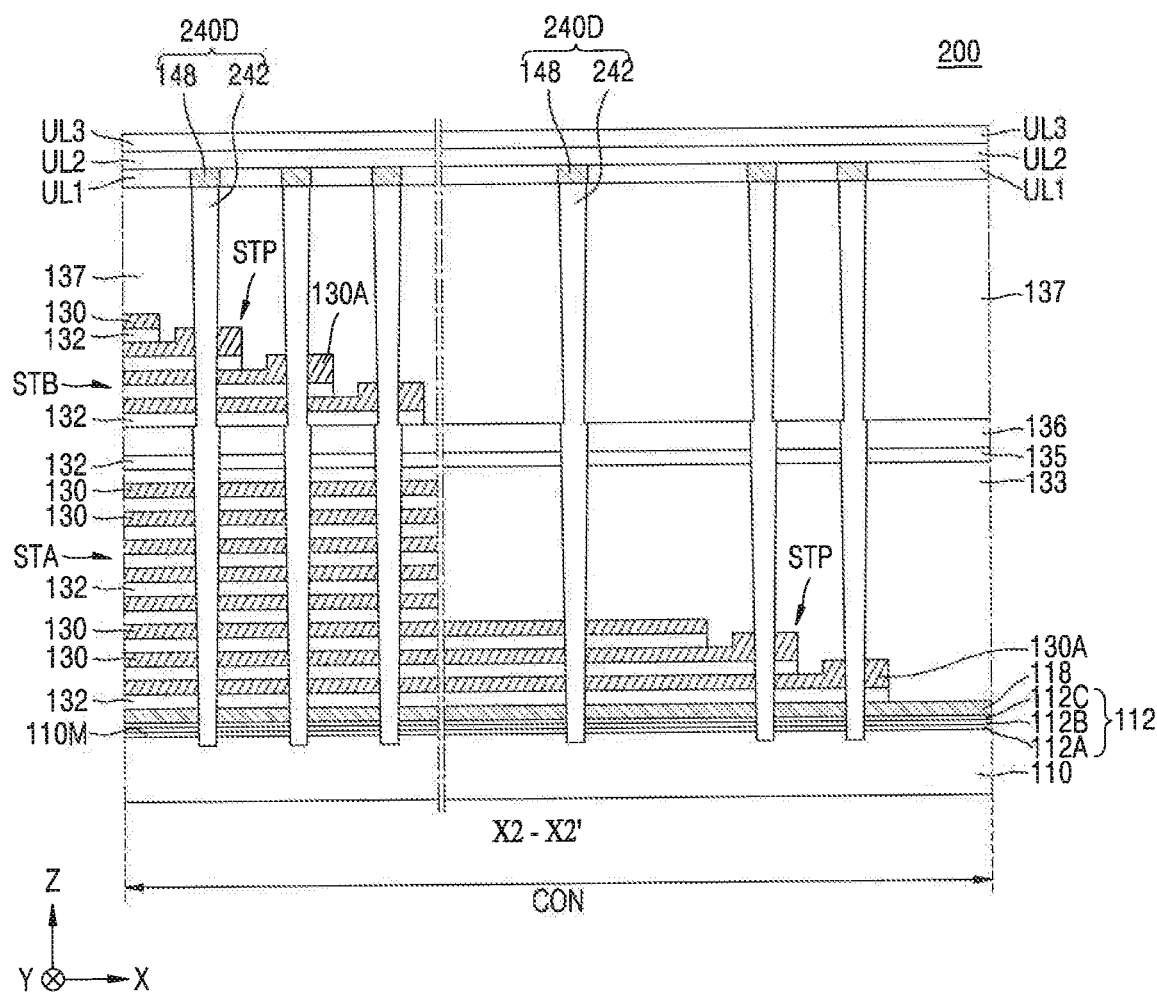
FIG. 7 is a cross-sectional view illustrating a semiconductor device according to an exemplary embodiment of the present inventive concept.

FIG. 7 is a cross-sectional view illustrating a semiconductor device 200 according to an exemplary embodiment of the present inventive concept. FIG. 7 illustrates some components of a portion corresponding to the cross-section taken along line X2-X2' of FIG. 5.

Referring to FIG. 7, the semiconductor device 200 may have substantially the same configuration as that of the semiconductor device 100 described above with reference to FIGS. 4 to 6D. However, the semiconductor device 200 includes a plurality of dummy channel structures 240D, instead of the dummy channel structures 140D.

The dummy channel structures 240D may have substantially the same configuration as that described for the dummy channel structures 140D. However, each of the dummy channel structures 240D may include a dummy insulating structure 242, instead of the gate dielectric film 142, the channel region 144, and the buried insulating film 146 illustrated in FIG. 6B. For example, the drain region 148 may be disposed on the dummy insulating structure 242; however, the present inventive concept is not limited thereto. In an exemplary embodiment of the present inventive concept, the drain region 148 in each of the dummy channel structures 240D may be omitted. In an exemplary embodiment of the present inventive concept, the dummy insulating structure 242 may include silicon oxide, but the present inventive concept is not limited thereto.

Figure 8:
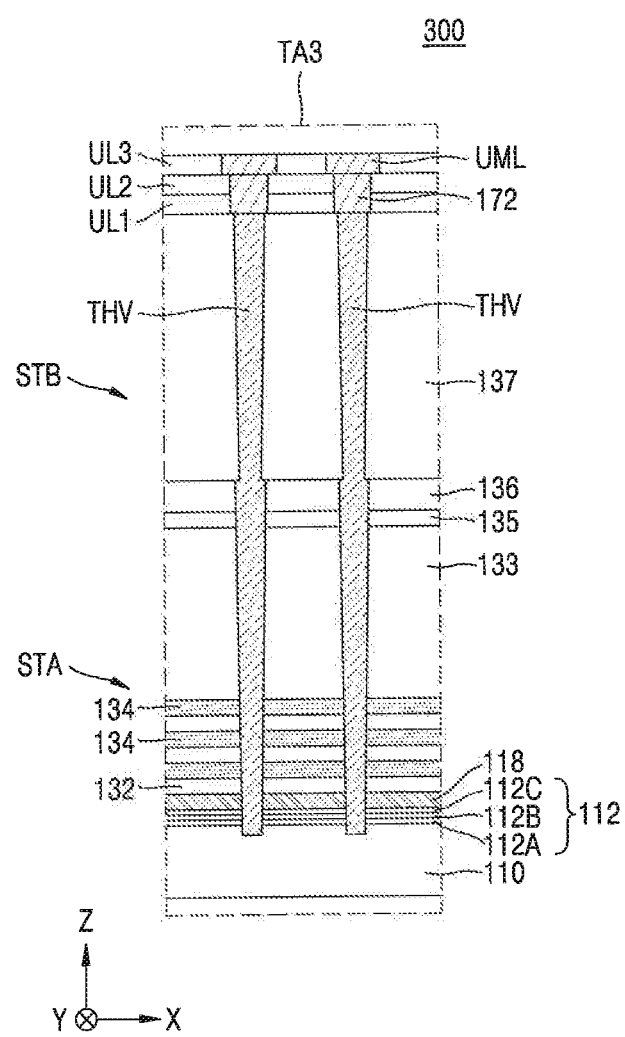
FIG. 8 is a cross-sectional view illustrating a semiconductor device according to an exemplary embodiment of the present inventive concept.

FIG. 8 is a cross-sectional view illustrating a semiconductor device 300 according to an exemplary embodiment of the present inventive concept. FIG. 8 illustrates a cross-sectional configuration of a partial region corresponding to the through-electrode region TA of FIGS. 5 and 6A.

Referring to FIG. 8, the semiconductor device 300 may have substantially the same configuration as that of the semiconductor device 100 described above with reference to FIGS. 5 and 6A to 6D. However, the semiconductor device 300 may include a through-electrode region TA3, instead of the through-electrode region TA.

In the semiconductor device 300, portions of the gate lines 130 (refer to FIG. 6A) are substituted with a sacrificial insulating film 134 in a portion of the stepped connection portion STP included in the first stack STA illustrated in FIGS. 5 and 6A corresponding to the through-electrode region TA3. In the through-electrode region TA3, a sidewall of each of the through-electrodes THV may have a structure surrounded by the insulating films 132 and the sacrificial insulating films 134. In an exemplary embodiment of the present inventive concept, the sacrificial insulating films 134 may include a silicon nitride film.

In an exemplary embodiment of the present inventive concept, a dam structure may be disposed between an insulating structure, which includes the insulating films 132 and the sacrificial insulating films 134 that constitute the through-electrode region TA3, and the gate lines 130 (refer to FIGS. 6A to 6C). A material of the dam structure is substantially the same as that described for the word line cut structure WLC (refer to FIG. 6C).

Figure 9A:
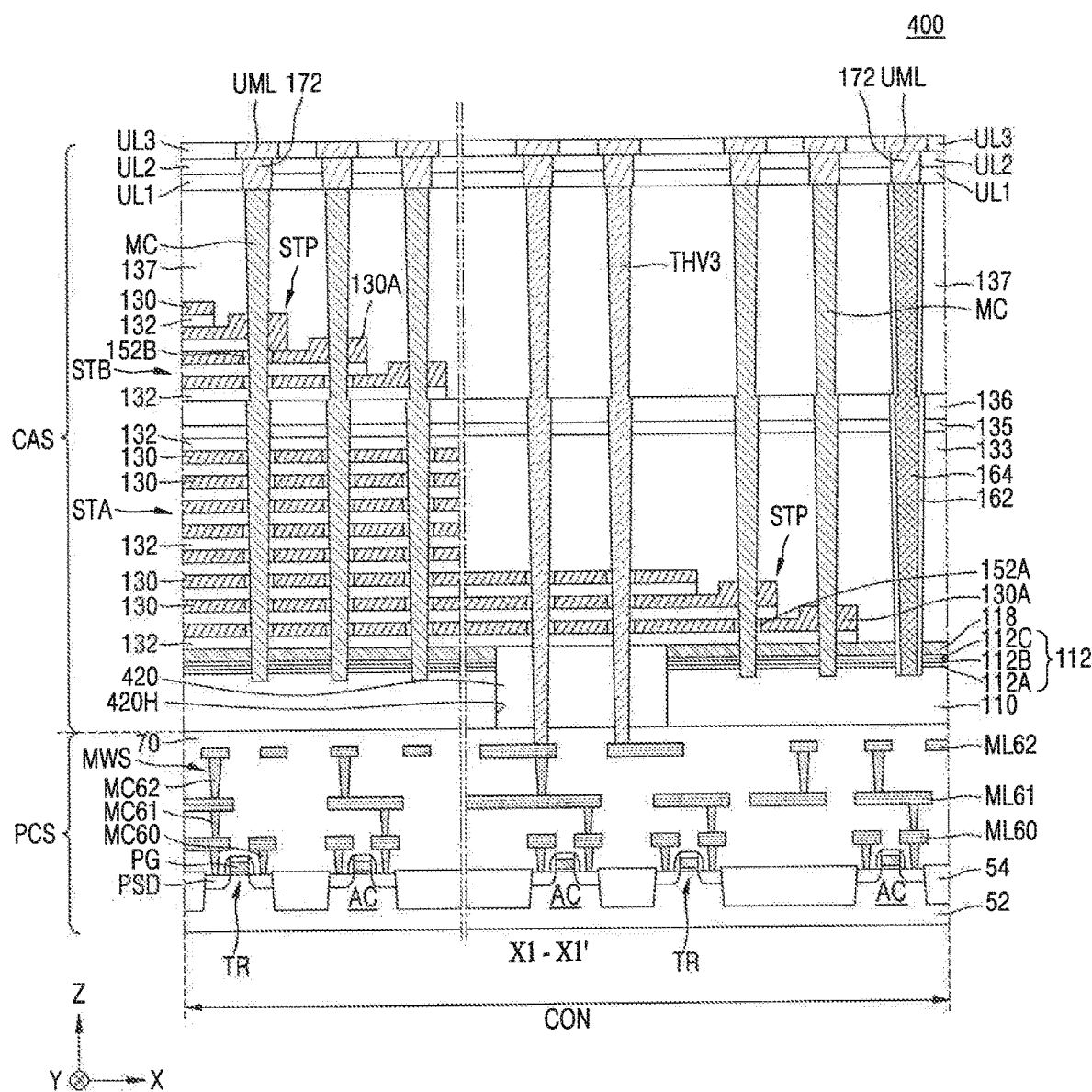
Figure 9B:
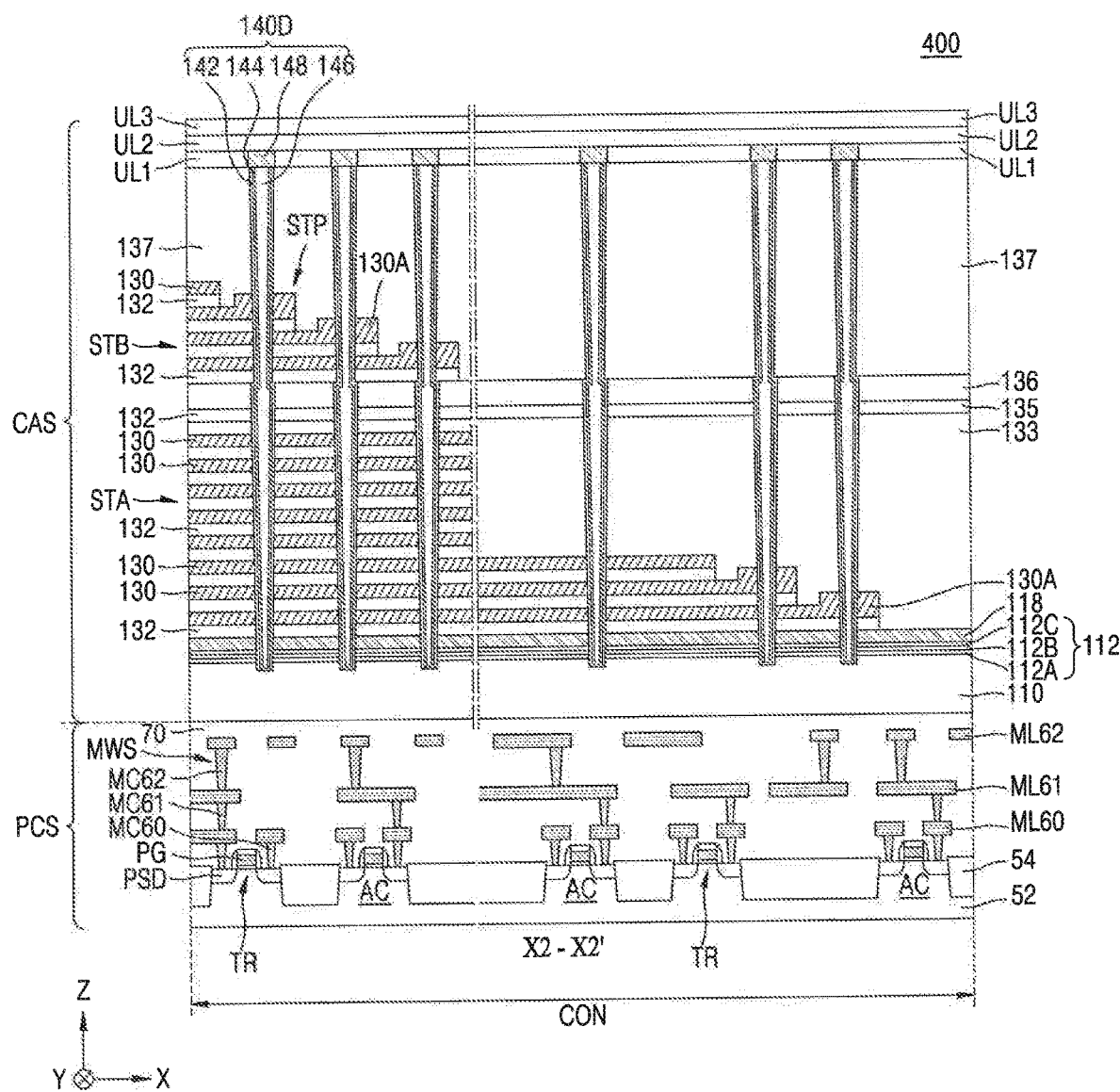
Figure 9C:
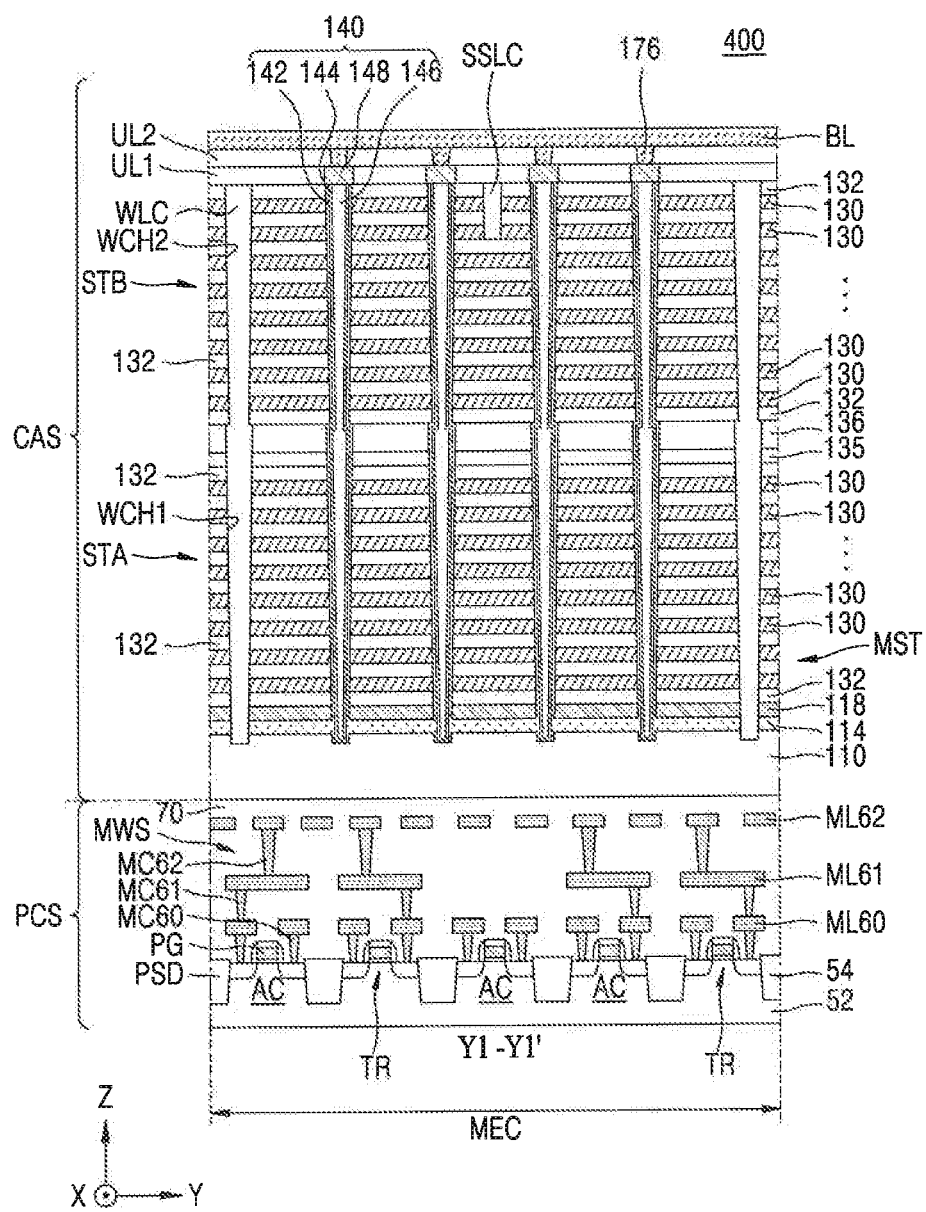

FIGS. 9A, 9B, and 9C are cross-sectional views illustrating a semiconductor device 400 according to an exemplary embodiment of the present inventive concept, in which FIG. 9A is a cross-sectional view of some components of a portion corresponding to the cross-section taken along line X1-X1' of FIG. 5, FIG. 9B is a cross-sectional view of some components of a portion corresponding to the cross-section taken along line X2-X2' of FIG. 5, and FIG. 9C is a cross-sectional view of some components of a portion corresponding to the cross-section taken along line Y1-Y1' of FIG. 5. In FIGS. 9A, 9B, and 9C, the same reference numerals as those in FIGS. 6A to 6C denote the same members or elements, and detailed descriptions thereof may be omitted herein.

Referring to FIGS. 9A, 9B, and 9C, the semiconductor device 400 may have substantially the same configuration as that of the semiconductor device 100 described above with reference to FIGS. 4 to 6D. However, the semiconductor device 400 may include a cell array structure CAS and a peripheral circuit structure PCS overlapping each other in the vertical direction (e.g., the Z direction). The cell array structure CAS may include the memory cell array 20 described above with reference to FIG. 1. The peripheral circuit structure PCS may include the peripheral circuit 30—described above with reference to FIG. 1. The cell array structure CAS may have substantially the same configuration as that described above with reference to FIGS. 5 and 6A to 6D.

The peripheral circuit structure PCS may include a lower substrate 52, a plurality of peripheral circuits formed on the lower substrate 52, and a multilayer wiring structure (MWS) connecting the peripheral circuits to components in the memory cell region MEC.

The lower substrate 52 may include a semiconductor substrate. For example, the lower substrate 52 may include Si, Ge, or SiGe. An active region AC may be provided in the lower substrate 52 by a device separation film 54. A plurality of transistors TR constituting a plurality of peripheral circuits may be formed on the active region AC. Each of the transistors TR may include a gate PG and a plurality of ion implantation regions PSD formed in the active region AC and on both sides of the gate PG. Each of the ion implantation regions PSD may constitute a source region or a drain region of each of the transistors TR.

The peripheral circuits included in the peripheral circuit structure PCS may include various circuits included in the peripheral circuit 30 described above with reference to FIG. 1. In an exemplary embodiment of the present inventive concept, the peripheral circuits included in the peripheral circuit structure PCS may include the row decoder 32, the page buffer 34, the data I/O circuit 36, the control logic 38, and the CSL driver 39 illustrated in FIG. 1.

The multilayer wiring structure MWS included in the peripheral circuit structure PCS may include a plurality of peripheral circuit wiring layers ML60, ML61, and ML62 and a plurality of peripheral circuit contacts MC60, MC61, and MC62. At least some of the peripheral circuit wiring layers ML60, ML61, and ML62 may be configured to be electrically connected to the transistor TR. The peripheral circuit contacts MC60, MC61, and MC62 may be configured to interconnect some transistors TR among the transistors TR and the peripheral circuit wiring layers ML60, ML61 and ML62.

FIGS. 9A, 9B, and 9C illustrate that the multilayer wiring structure MWS has three wiring layers in the vertical direction (e.g., the Z direction), but the present inventive concept is not limited to that illustrated in FIGS. 9A, 9B, and 9C. For example, the multilayer wiring structure MWS may have two or more wiring layers.

Each of the peripheral circuit wiring layers ML60, ML61, and ML62 and the peripheral circuit contacts MC60, MC61, and MC62 may include, for example, a metal, conductive metal nitride, metal silicide, or a combination thereof. For example, the peripheral circuit wiring layers ML60, ML61, and ML62 and the peripheral circuit contacts MC60, MC61, and MC62 may include a conductive material such as tungsten, molybdenum, titanium, cobalt, tantalum, nickel, tungsten silicide, titanium silicide, cobalt, silicide, tantalum silicide, or nickel silicide.

The transistors TR and the multilayer wiring structure MWS included in the peripheral circuit structure PCS may be covered with an interlayer insulating film 70. The interlayer insulating film 70 may include, for example, silicon oxide, SiON, SiOCN, or the like.

As illustrated in FIGS. 9A and 9B, in the connection region CON of the cell array structure CAS, the substrate 110 is disposed on the peripheral circuit structure PCS, and the insulating plate 112, the second conductive plate 118, the first stack STA, and the second stack STB may be sequentially stacked on the substrate 110.

As illustrated in FIG. 9C, in the memory cell region MEC of the cell array structure CAS, the substrate 110 may be disposed on the peripheral circuit structure PCS, and the first conductive plate 114, the second conductive plate 118, the first stack STA, and the second stack STB may be sequentially stacked on the substrate 110.

As illustrated in FIG. 9A, a plurality of through-openings 420H passing through the substrate 110, the insulating plate 112, and the second conductive plate 118 may be formed in a portion of the connection region CON. Each of the through-openings 420H may be filled with an insulating plug 420. The through-openings 420H may be disposed at positions overlapping a portion of the peripheral circuit structure PCS in the vertical direction (e.g., the Z direction). The insulating plug 420 may include, for example, a silicon oxide film, a silicon nitride film, or a combination thereof.

In the connection region CON, the through-electrodes THV may extend through the through-opening 4201H and into the peripheral circuit structure PCS, respectively, and may be electrically connected to one wiring layer among the peripheral circuit wiring layers ML60, ML61, and ML62. For example, each of the through-electrodes THV may be configured to be electrically connected to the peripheral circuit wiring layer ML62 of the uppermost layer closest to the cell array structure CAS among the peripheral circuit wiring layers ML60. ML61, and ML62. Each of the through-electrodes THV may be configured to be connected to at least one peripheral circuit among the peripheral circuits through the multilayer wiring structure MWS included in the peripheral circuit structure PCS.

Figure 10:
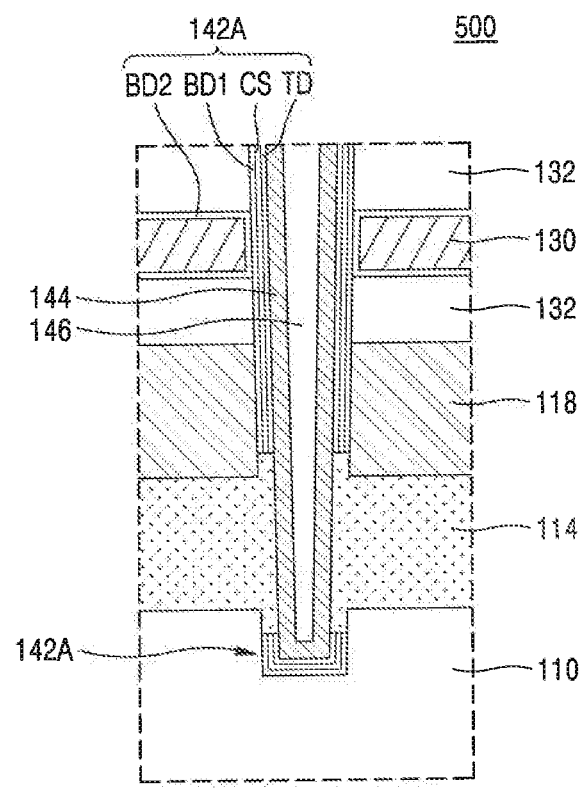
FIG. 10 is a cross-sectional view illustrating a semiconductor device according to an exemplary embodiment of the present inventive concept.

FIG. 10 is a cross-sectional view illustrating a semiconductor device 500 according to an exemplary embodiment of the present inventive concept. FIG. 10 illustrates an enlarged cross-sectional configuration of a portion corresponding to the region indicated by "EX1" in FIG. 6C.

Referring to FIG. 10, the semiconductor device 500 may have substantially the same configuration as that of the semiconductor device 100 described above with reference to FIGS. 4 to 6D. However, the semiconductor device 500 may include a gate dielectric film 142A, instead of the gate dielectric film 142. The gate dielectric film 142A may have substantially the same configuration as that of the gate dielectric film 142 described above with reference to FIGS. 6B, 6C, and 6D. However, the gate dielectric film 142A may include a first blocking dielectric film BD1 and a second blocking dielectric film BD2, instead of the blocking dielectric film BD illustrated in FIG. 6D. The first blocking dielectric film BD1 may extend parallel to the channel region 144, and the second blocking dielectric film BD2 may be disposed to surround the gate line 130. Each of the first blocking dielectric film BD1 and the second blocking dielectric film BD2 may include, for example, silicon oxide, silicon nitride, or metal oxide. For example, the first blocking dielectric film BD1 may include silicon oxide, and the second blocking dielectric film BD2 may include metal oxide having permittivity greater than that of a silicon oxide film; however, the present inventive concept is not limited thereto, and for example, the first blocking dielectric film BD1 and the second blocking dielectric film BD2 may include the same material as each other. The metal oxide may include hafnium oxide, aluminum oxide, zirconium oxide, tantalum oxide, or a combination thereof.

Figure 11:
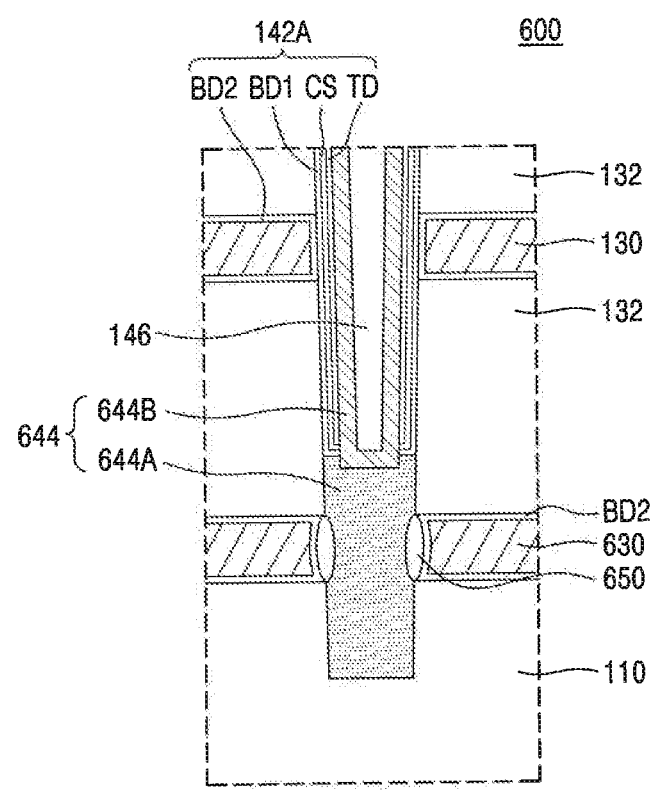
FIG. 11 is a cross-sectional view illustrating a semiconductor device according to an exemplary embodiment of the present inventive concept.

FIG. 11 is a cross-sectional view illustrating a semiconductor device 600 according to an exemplary embodiment of the present inventive concept. FIG. 11 illustrates an enlarged cross-sectional configuration of a portion corresponding to the region indicated by "EX1" in FIG. 6C.

Referring to FIG. 11, the semiconductor device 600 may have substantially the same configuration as that of the semiconductor device 100 described above with reference to FIGS. 4 to 6D. However, the semiconductor device 600 may include a gate dielectric film 142A, instead of the gate dielectric film 142. The gate dielectric film 142A may include a first blocking dielectric film BD1 and a second blocking dielectric film BD2. For details of the first blocking dielectric film BD1 and the second blocking dielectric film BD2, the description above with reference to FIG. 10 may be referred to.

The semiconductor device 600 may include a ground select gate line 630 disposed between the substrate 110 and the gate lines 130. In addition, the semiconductor device 600 may include a channel region 644, instead of the channel region 144 of the semiconductor device 100. The channel region 644 may include a lower semiconductor pattern 644A and an upper semiconductor pattern 644B. The lower semiconductor pattern 644A may include a semiconductor material layer epitaxially grown from the substrate 110. The lower semiconductor pattern 644A may have a pillar shape or quadrangular shape, and an upper surface of the lower semiconductor pattern 644A may be positioned above an upper surface of the lowermost ground select gate line 630. The upper semiconductor pattern 644B and the lower semiconductor pattern 644A may contact each other. The lower semiconductor pattern 644A may include, for example, Si, Ge, or a combination thereof. The upper semiconductor pattern 644B may have substantially the same configuration as that described above for the channel region 144 with reference to FIGS. 6B, 6C, and 6D.

The ground select gate line 630 may be surrounded by the second blocking dielectric film BD2. Between the ground select gate line 630 and the lower semiconductor pattern 644A, a gate dielectric film 650 may be disposed between the second blocking dielectric film BD2 and the lower semiconductor pattern 644A.

Figure 12:
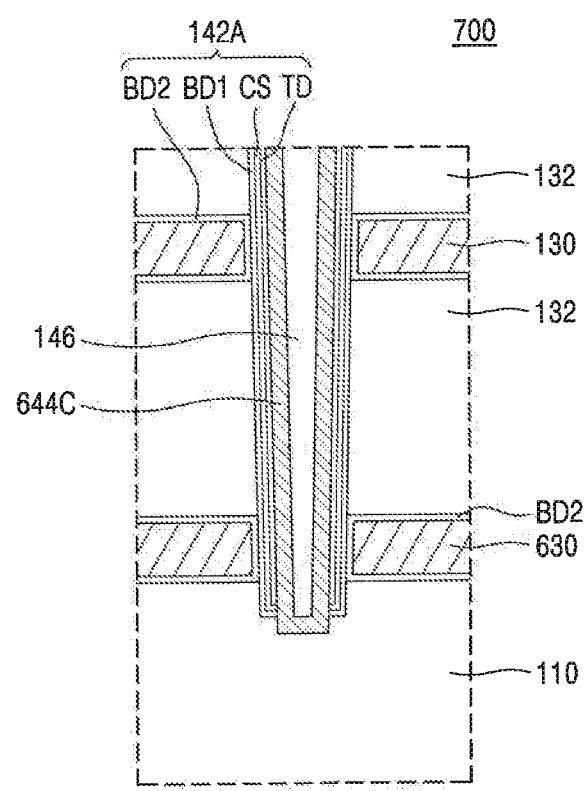
FIG. 12 is a cross-sectional view illustrating a semiconductor device according to an exemplary embodiment of the present inventive concept.

FIG. 12 is a cross-sectional view illustrating a semiconductor device 700 according to an exemplary embodiment of the present inventive concept. FIG. 12 illustrates an enlarged cross-sectional configuration of a portion corresponding to the region indicated by "EX1" in FIG. 6C.

Referring to FIG. 12, the semiconductor device 700 may have substantially the same configuration as that of the semiconductor device 600 described above with reference to FIG. 11. However, the semiconductor device 700 might not include the lower semiconductor pattern 644A illustrated in FIG. 11. The semiconductor device 700 may include a channel region 644C, instead of the channel region 144 of the semiconductor device 100. A lower end portion of the channel region 644C may be in contact with the substrate 110. A gate dielectric film 142A may be between the channel region 644C and the ground select gate line 630. A more detailed configuration of the channel region 644C is substantially the same as that described above for the channel region 144 with reference to FIGS. 6B to 6D.

Next, a method of manufacturing a semiconductor device according to an exemplary embodiment of the present inventive concept is described in detail.

FIGS. 13A to 19C are cross-sectional views illustrating a method of manufacturing a semiconductor device according to an exemplary embodiment of the present inventive concept. In particular, FIGS. 13A, 14A, 15A, 16A, 17A, 18A, and 19A are cross-sectional views of a process sequence of some components of a portion corresponding to the cross-section taken along line X1-X1' of FIG. 5. FIGS. 13B, 14B, 15B, 16B, 17B, 18B, and 19B are cross-sectional views of a process sequence of some components of a portion corresponding to the cross-section taken along line X2-X2' of FIG. 5, and FIGS. 13C, 16C, 17C, 18C, and 19C are cross-sectional views of a process sequence of some components of a portion corresponding to the cross-section taken along line Y1-Y1' of FIG. 5. An example of a method of manufacturing the semiconductor device 100 illustrated in FIGS. 4 to 6D are described with reference to FIGS. 13A to 19C.

Figure 13A:
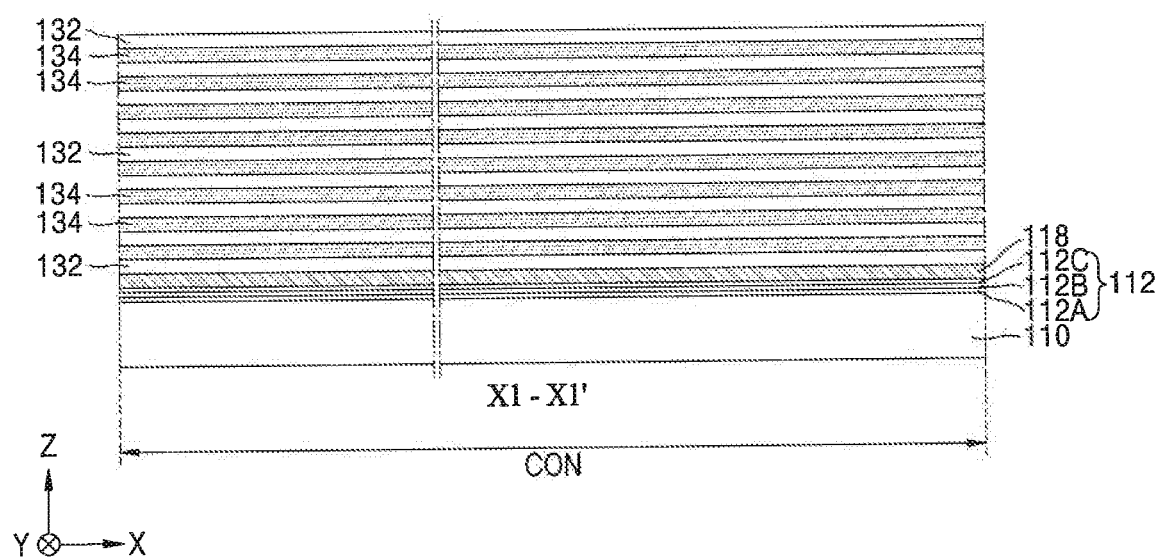
Figure 13B:
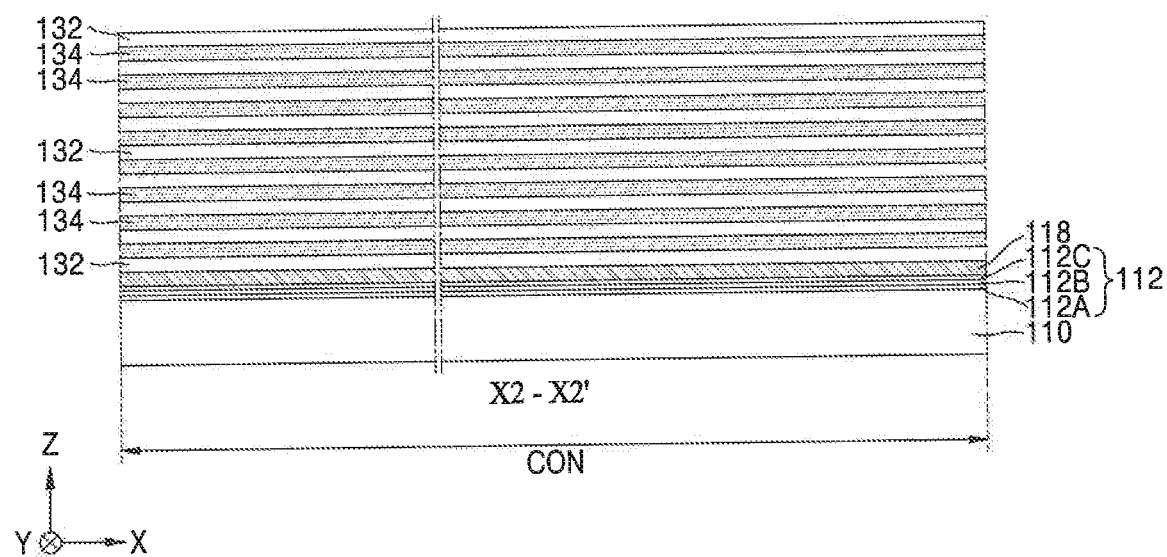
Figure 13C:
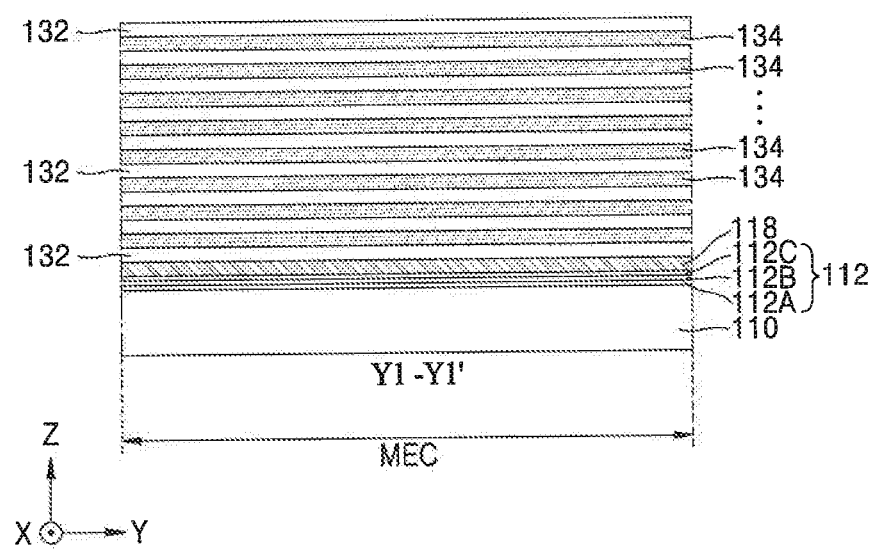

Referring to FIGS. 13A, 13B, and 13C, the insulating plate 112 and the second conductive plate 118 may be sequentially formed on the substrate 110 in the memory cell region MEC and the connection region CON. The insulating plate 112 may include an insulating film having a multilayer structure including a first insulating film 112A, a second insulating film 112B, and a third insulating film 112C.

A plurality of insulating films 132 and a plurality of sacrificial insulating films 134 may be alternately stacked one by one on the second conductive plate 118 in the memory cell region MEC and the connection region CON. For example, the insulating films 132 may include silicon oxide film, and the sacrificial insulating films 134 may include silicon nitride. The sacrificial insulating films 134 may each secure a space for forming the gate lines 130 in a subsequent process.

Figure 14A:
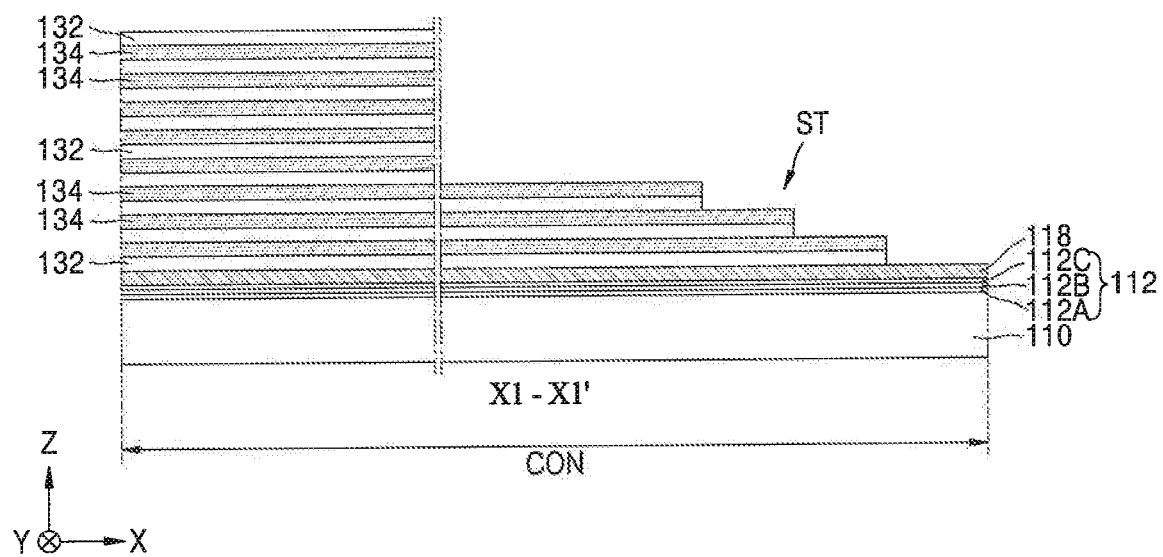
Figure 14B:
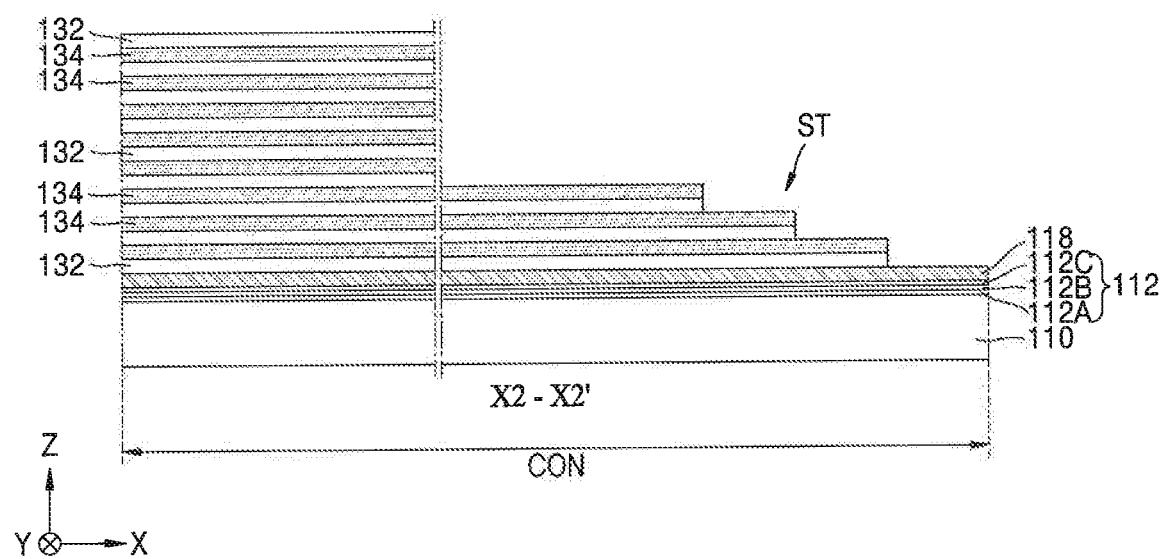

Referring to FIGS. 14A and 14B, after an etch stop layer covering the uppermost insulating film 132 among the insulating films 132 in a resultant structure of FIGS. 13A, 13B, and 13C, some of the insulating films 132 and the sacrificial insulating films 134 may be removed using a photolithography process in the connection region CON to form a step structure ST in which one end portion of each of the insulating films 132 and the sacrificial insulating films 134 has a width gradually decreasing in a horizontal direction as the distance away from the substrate 110 increases.

Figure 15A:
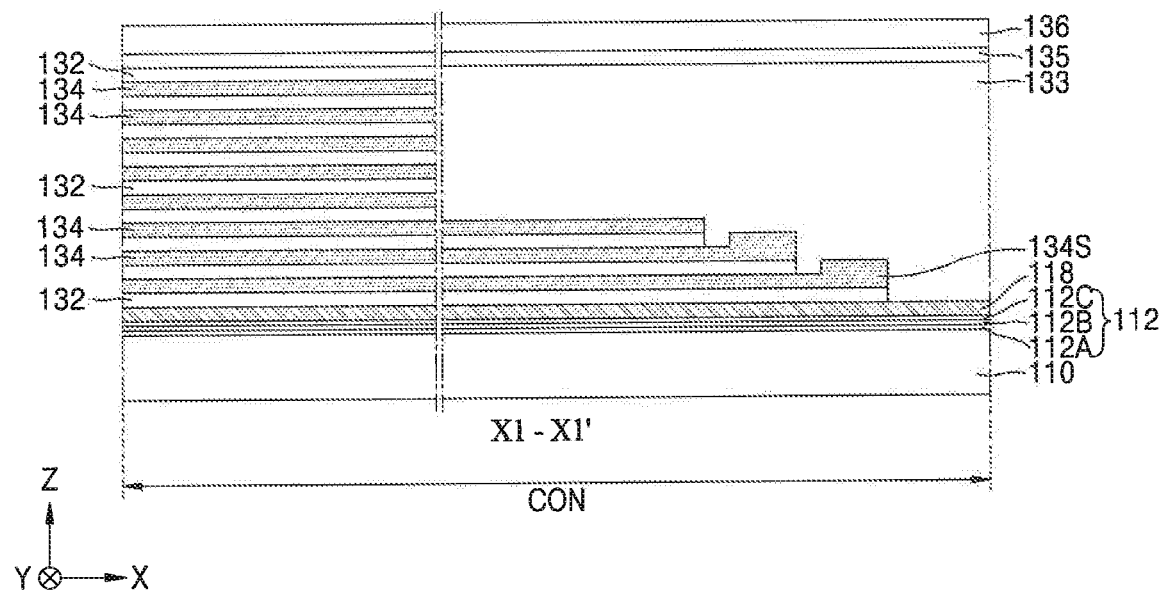
Figure 15B:
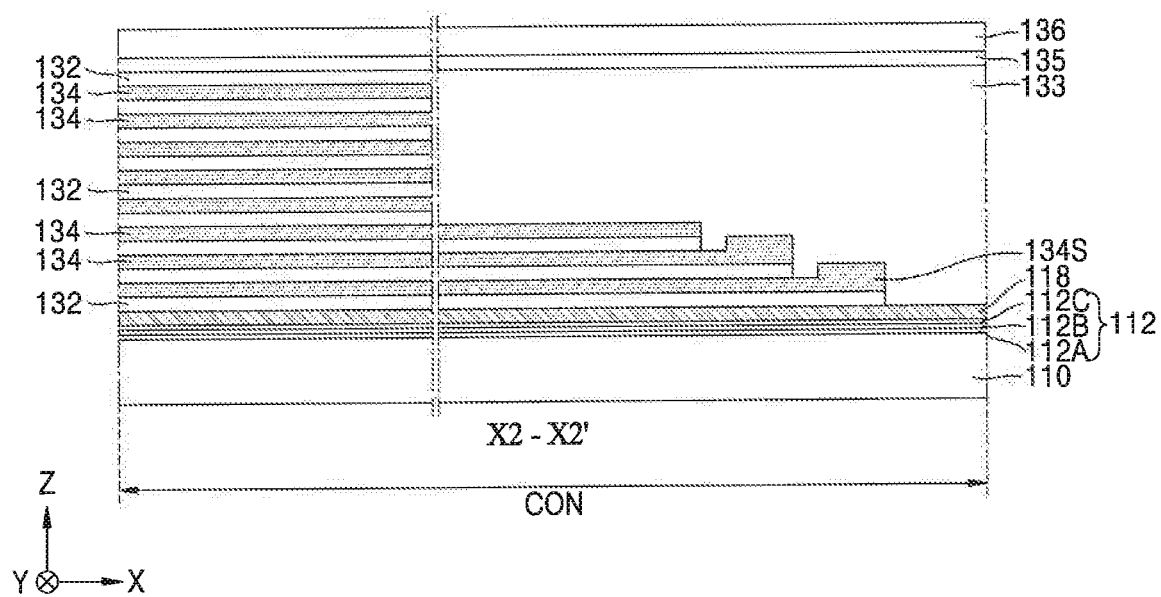

Referring to FIGS. 15A and 15B, a sacrificial pad portion 134S having an increased thickness may be formed at one end portion of each of the sacrificial insulating films 134 forming the step structure ST in a resultant structure of FIGS. 14A and 14B.

In an exemplary embodiment of the present inventive concept, to form the sacrificial pad portion 134S at one end portion of each of the sacrificial insulating films 134, some of the insulating films 132 may be removed to expose one end portion of each of the sacrificial insulating films 134 forming the step structure ST, an additional film including the same material as a constituent material of the plurality of sacrificial insulating films 134 may be deposited on the exposed end portion of each of the sacrificial insulating films 134, and the additional film may then be patterned so that the sacrificial pad portion 134S may remain.

Thereafter, the lower insulating block 133 covering the step structure ST and the second conductive plate 118 may be formed, and a resultant structure may be planarized by, for example, a chemical mechanical polishing (CMP) process to remove unnecessary films to expose an upper surface of the uppermost insulating film 132.

Details of the constituent material of the lower insulating block 133 are described above with reference to FIGS. 6A and 6B. In an exemplary embodiment of the present inventive concept, to form the lower insulating block 133, a plasma enhanced chemical vapor deposition (PECVD) process may be performed using monosilane ($SiH_4$) or disilane ($Si_2H_6$) as a silicon precursor and $O_2$, $O_3$, $N_2O$, $CO_2$, or a combination thereof as an oxygen source. During the PECVD process, an in-situ doping process in which a dopant source is supplied together may be performed to form a doped silicon oxide film.

In an exemplary embodiment of the present inventive concept, to form a silicon oxide film, which is doped with a phosphorus (P) element, $PH_3$, $P_4O_4$, $H_3PO_4$, $PF_3$, $PCl_3$, $PBr_3$, $PI_3$, $PF_5$, $PCl_5$, $PBr_5$, $PI_5$, etc. may be used as a phosphorus (P) source, but the present inventive concept is not limited thereto. To form a silicon oxide film doped with a nitrogen (N) element, ammonia ($NH_3$) gas may be used as a nitrogen (N) source, but the present inventive concept is not limited thereto. To form a silicon oxide film, which is doped with a boron (B) element, trialkylboron compounds, for example, trimethylboron ($B(CH_3)_3$) or triethylboron ($B(C_2H_5)_3$)) may be used as a boron (B) source, but present inventive concept is not limited thereto. To form a silicon oxide film, which is doped with a fluorine (F) element, $TiF_4$, $TaF_5$, etc. may be used as a fluorine (F) source, but the present inventive concept is not limited thereto. To form a silicon oxide film, which is doped with a carbon (C) element, $CH_4$, $C_2H_4$, $C_2H_6$, $C_3H_7$, $C_3H_8$, i-$C_4H_{10}$, n-$C_4H_{10}$, $CBr_4$, $CCl_4$, trimethylaluminum, trimethylgallium, trimethylindium, etc. may be used as a carbon (C) source, but the present inventive concept is not limited thereto.

Thereafter, the first intermediate insulating film 135 and the second intermediate insulating film 136, which are disposed on upper surfaces of the uppermost insulating film 132 and the lower insulating block 133, may be sequentially formed.

In an exemplary embodiment of the present inventive concept, to form the first intermediate insulating film 135 and the second intermediate insulating film 136, processes similar to those described above with respect to the forming process of the lower insulating block 133 may be performed.

Figure 16A:
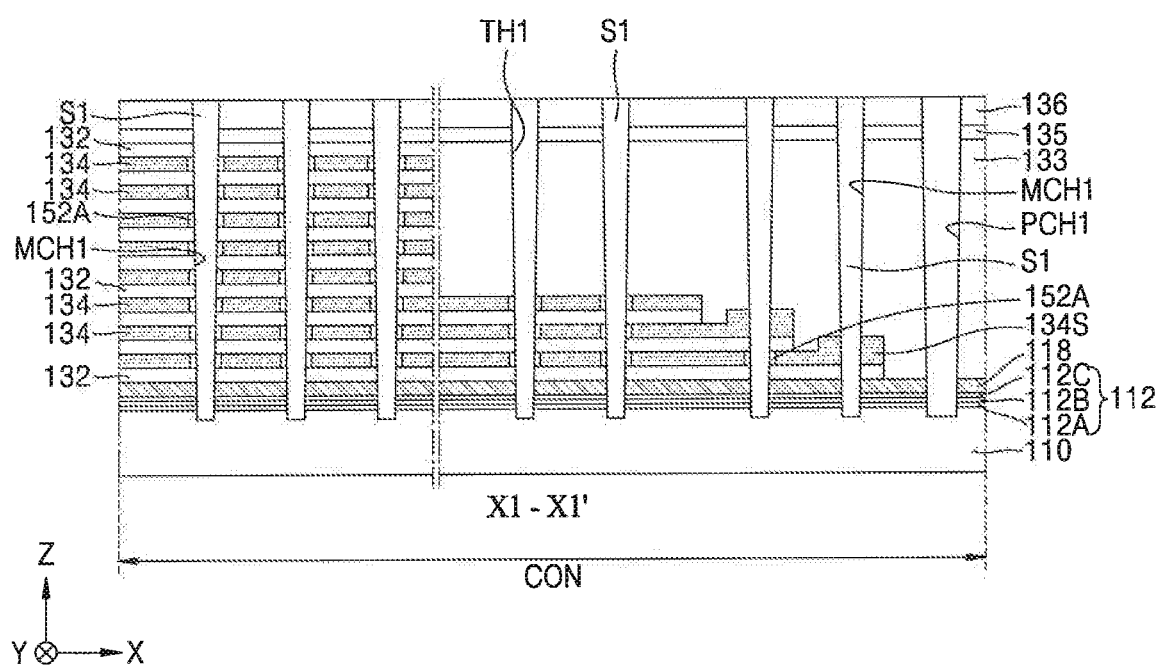
Figure 16B:
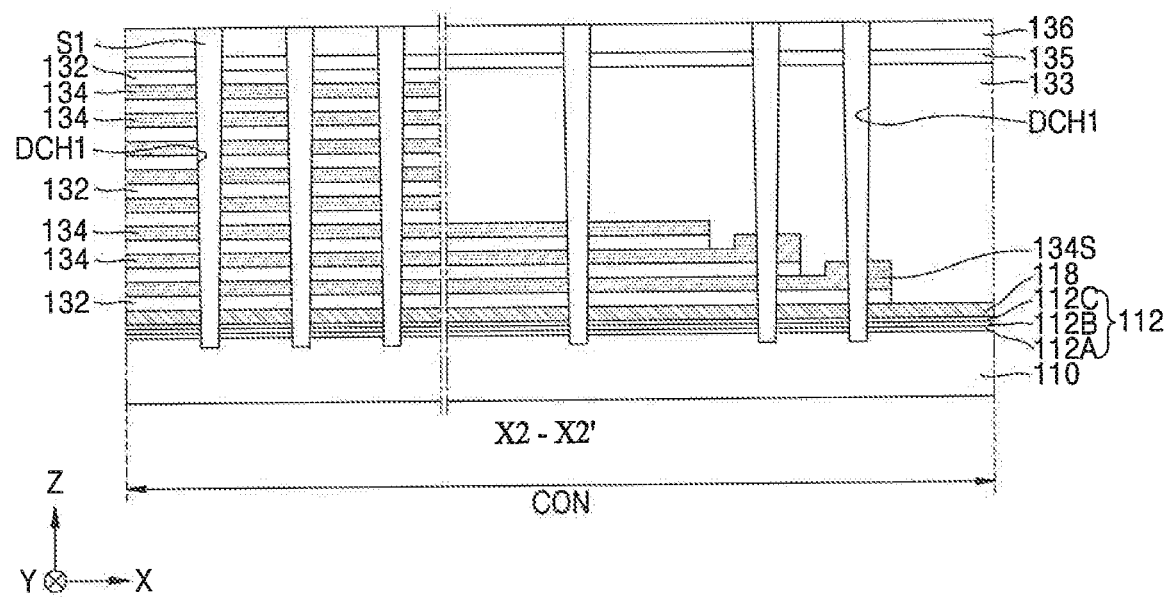
Figure 16C:
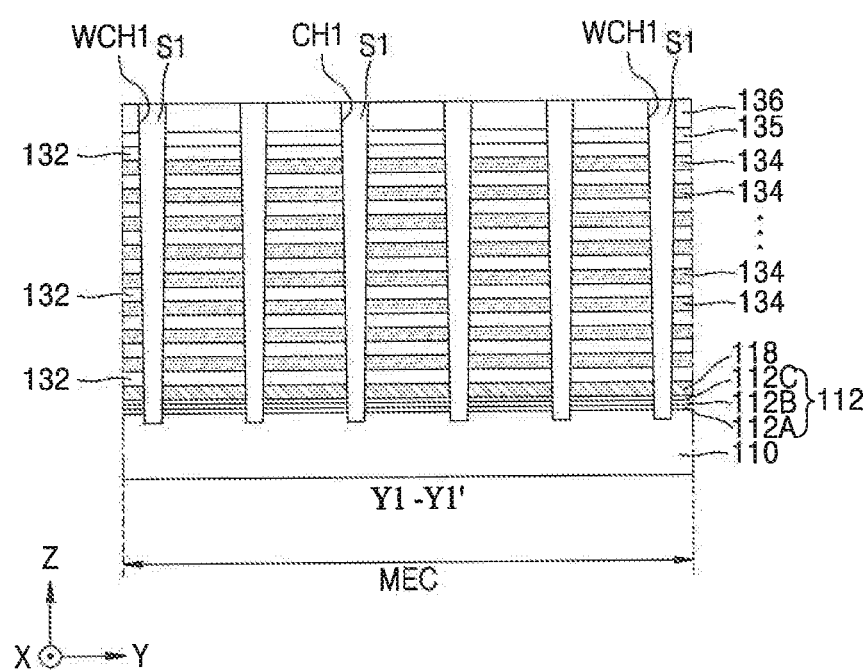

Referring to FIGS. 16A, 16B, and 16C, in the connection region CON and the memory cell region MEC, the stack structure of the second intermediate insulating film 136, the first intermediate insulating film 135, the lower insulating block 133, the insulating films 132, the sacrificial insulating films 134, the second conductive plate 118, and the insulating plate 112 may be dry-etched to form a plurality of lower vertical holes therein, simultaneously. The lower vertical holes may include a plurality of lower memory cell contact holes MCH1, a lower plate contact hole PCH1, a plurality of lower dummy channel holes DCH1, and a plurality of lower through-holes TH1 disposed in the connection region CON. The lower vertical holes may additionally include a plurality of lower channel holes CH1 and a plurality of lower word line cut holes WCH1 disposed in the memory cell region MEC. Although not illustrated in FIGS. 16A, 16B, and 16C, the lower vertical holes may further include a plurality of lower holes to form the insulating support structures SP illustrated in FIG. 5.

Thereafter, as illustrated in FIG. 16A, portions of the sacrificial pad portion 134S and the sacrificial insulating film 134 exposed inside each of the lower memory cell contact holes MCH1 and the lower through-holes TH1 may be etched to expand horizontal widths of the lower memory cell contact holes MCH1 and the lower through-holes TH1 at the same vertical level as that of the sacrificial insulating film 134 to form a plurality of indent spaces exposing a sidewall of the sacrificial insulating film 134 and the sacrificial pad portion 134S. The indent space exposing the sacrificial insulating film 134, among the indent spaces, may be filled with the first insulating ring 152A, and the indent space exposing the sacrificial pad portion 134s may be filled with the sacrificial pad portion 134S again. Thereafter, a plurality of first sacrificial films S1 may be formed to fill the lower vertical holes. In an exemplary embodiment of the present inventive concept, the first sacrificial films S1 may include, but are not limited to, a silicon oxide film, a polysilicon film, a carbon film, or a tungsten film.

Figure 17A:
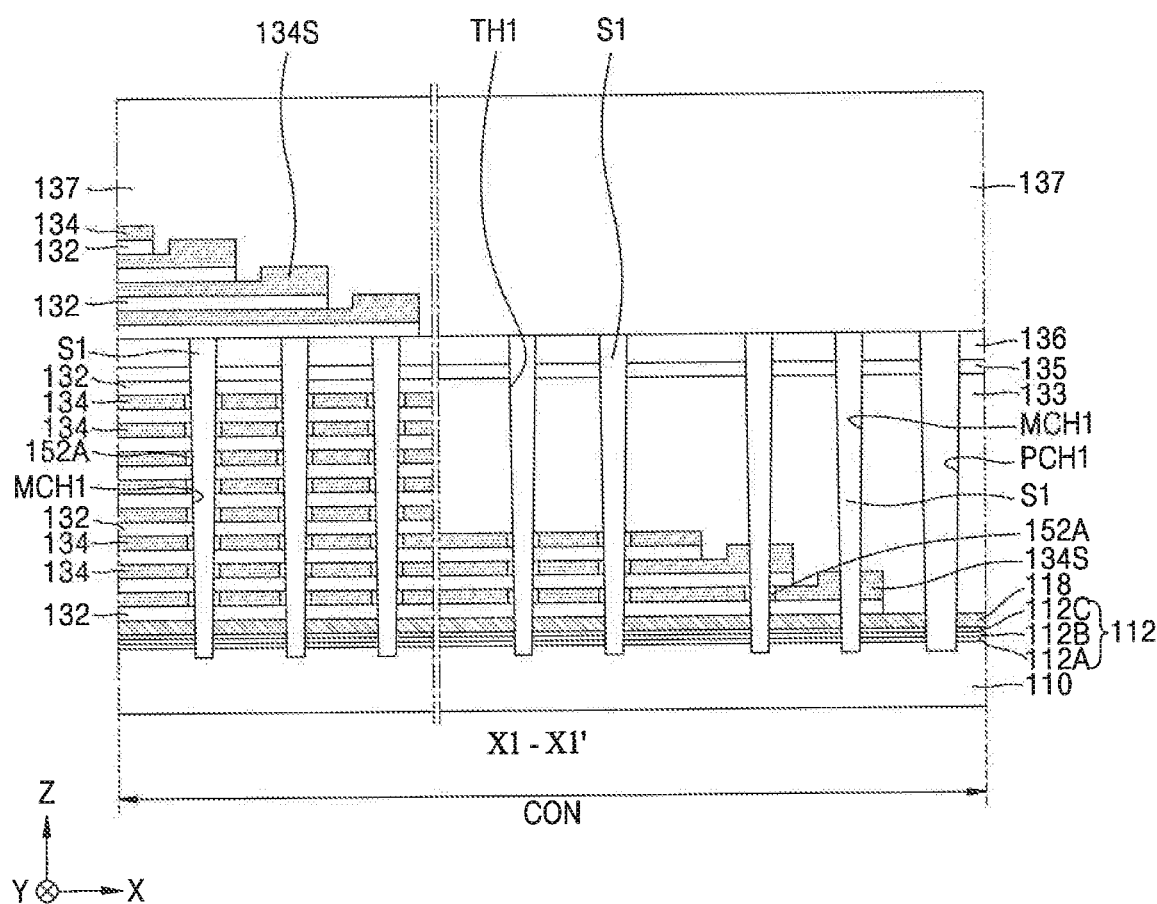
Figure 17B:
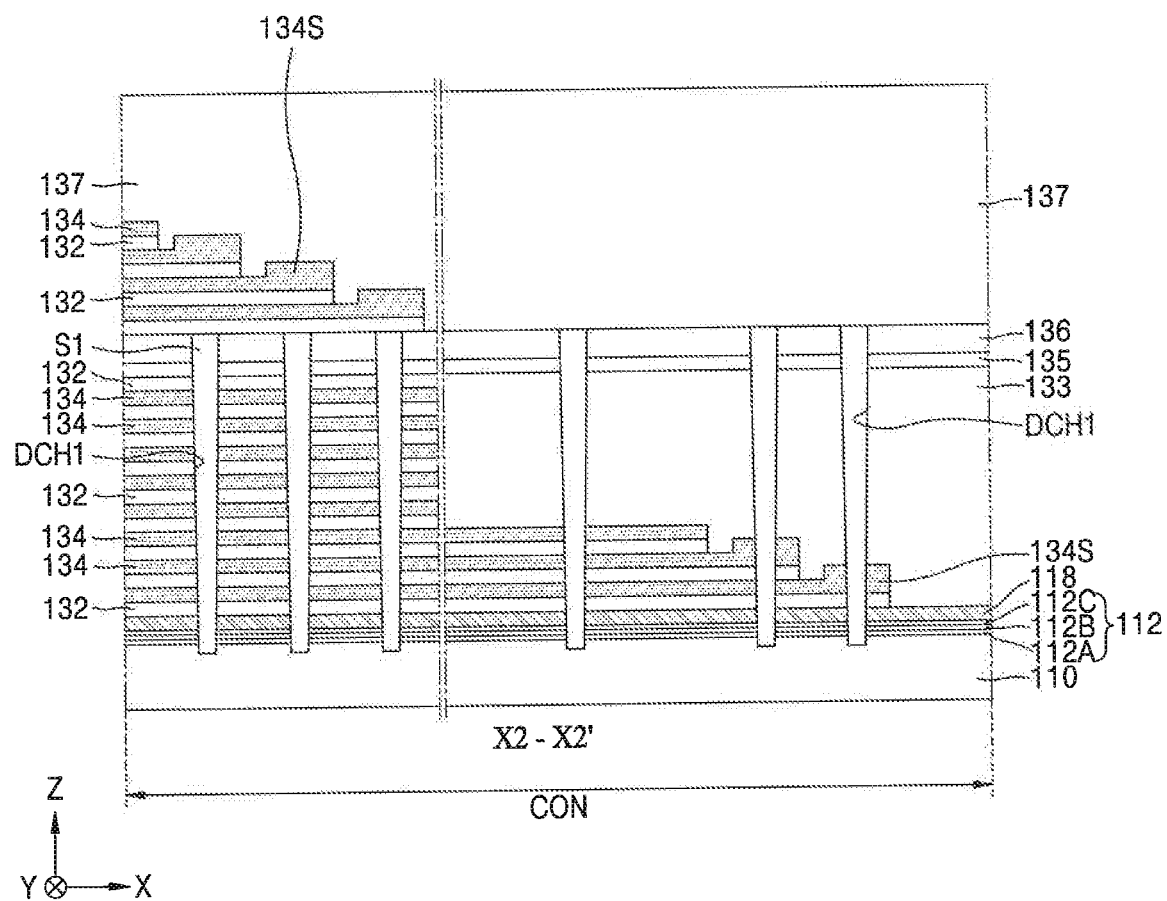
Figure 17C:
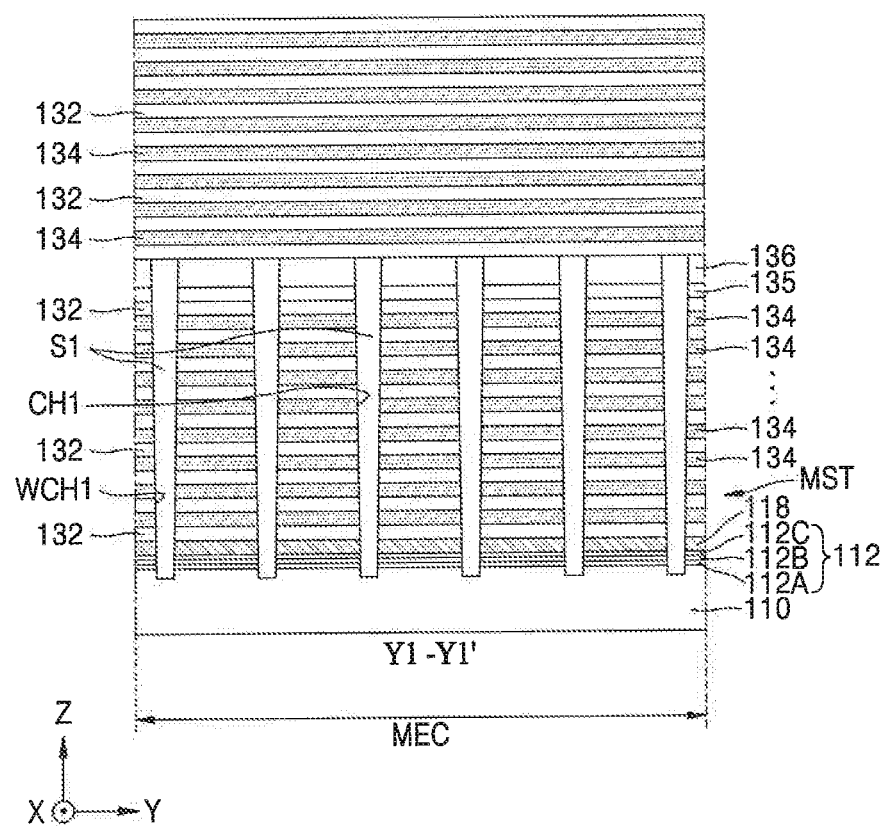

Referring to FIGS. 17A, 17B, and 17C, processes similar to those described above with reference to FIGS. 13A to 14B may be performed on a resultant structure of FIGS. 16A, 16B, and 16C to form a structure including the insulating films 132, the sacrificial insulating films 134, and the sacrificial pad portions 134S that are for forming the second stack STB (refer to FIGS. 6A to 6C) on the second intermediate insulating film 136 and for forming the upper insulating block 137 covering the structure in the connection region CON.

To form the upper insulating block 137, a process similar to that described with respect to the forming process of the lower insulating block 133 with reference to FIGS. 15A and 15B may be performed. In an exemplary embodiment of the present inventive concept, the upper insulating block 137 may include the same material as that of the lower insulating block 133.

Figure 18A:
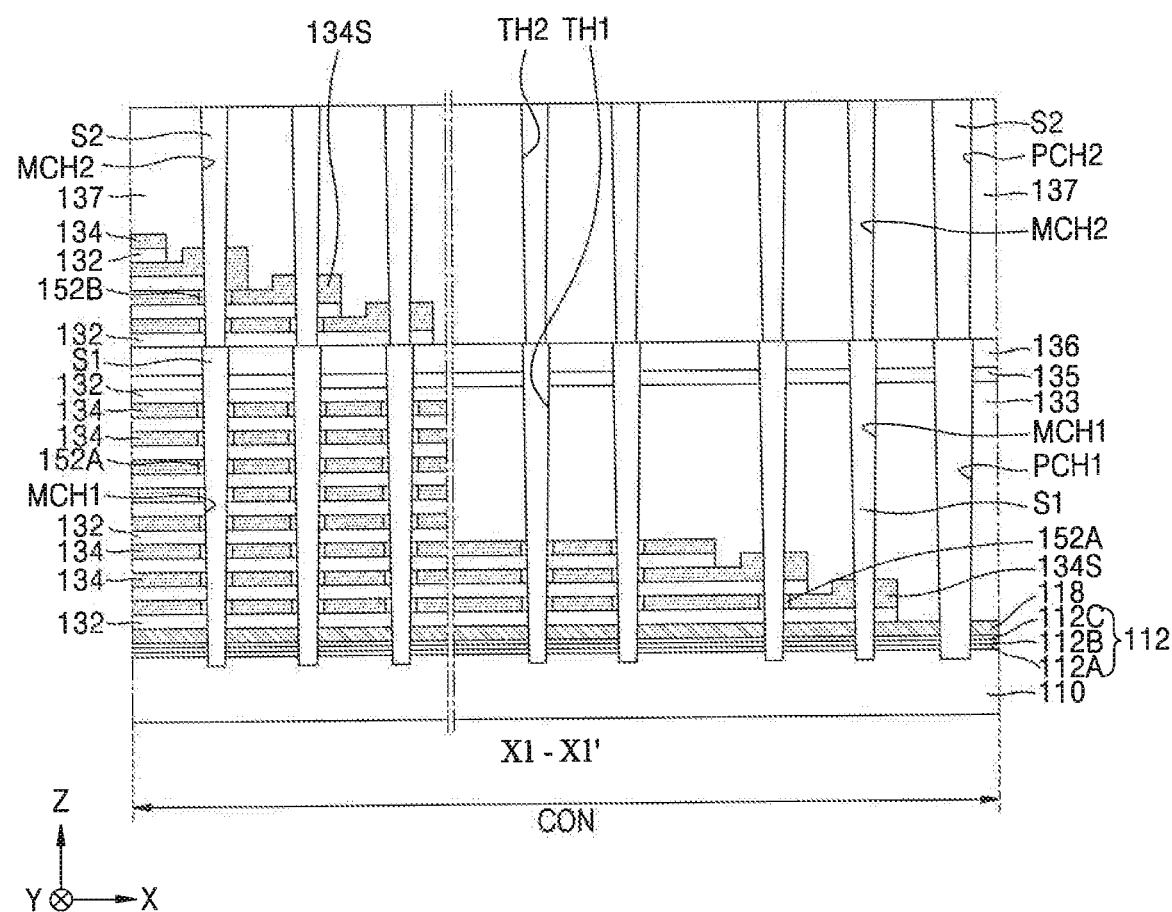
Figure 18B:
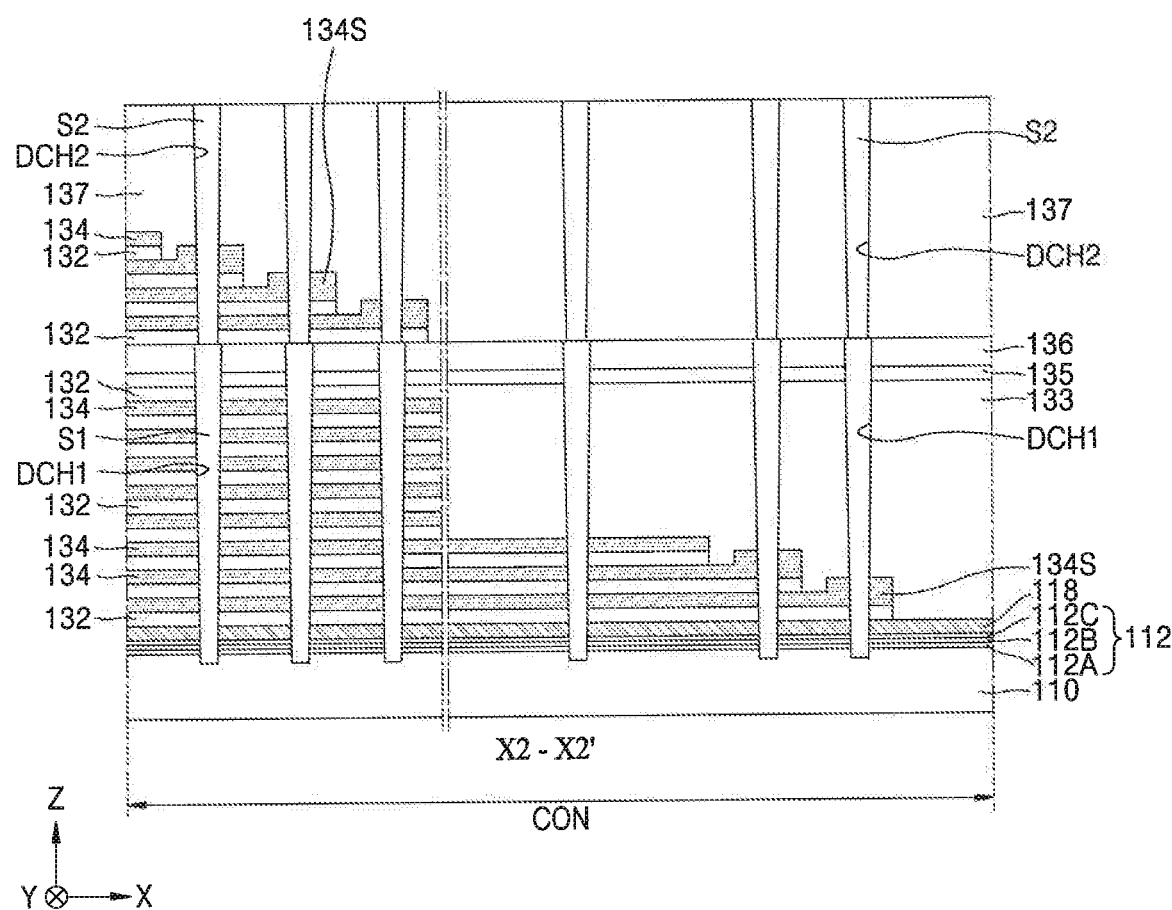
Figure 18C:
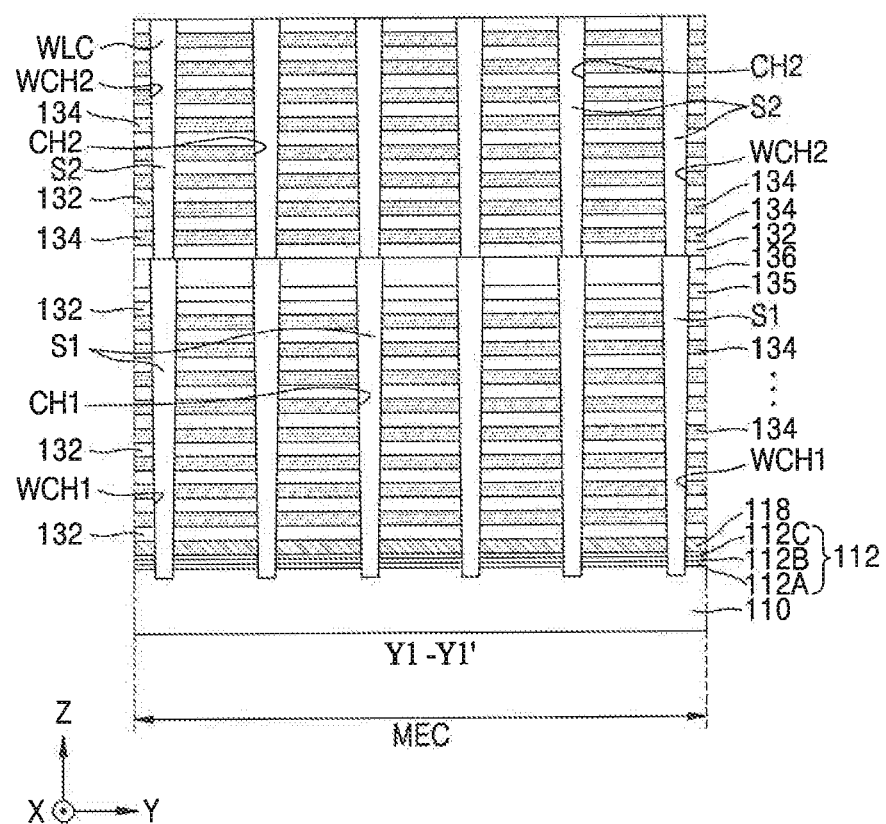

Referring to FIGS. 18A, 18B, and 18C, in the connection region CON of a resultant structure of FIGS. 17A, 17B, and 17C and the memory cell region MEC, the structure including the insulating films 132, the sacrificial insulating films 134, and the sacrificial pad portions 134S for forming the second stack STB (refer to FIGS. 6A to 6C) and the upper insulating block 137 may be dry-etched to form a plurality of upper vertical holes connected to the lower vertical holes simultaneously. The upper vertical holes may include a plurality of upper memory cell contact holes MCH2, an upper plate contact hole PCH2, a plurality of upper dummy channel holes DCH2, and a plurality of upper through-holes disposed in the connection region CON. The upper vertical holes may further include a plurality of upper dummy channel holes CH2 and a plurality of upper word line cut holes WCH2 disposed in the memory cell region MEC. The upper vertical holes may further include a plurality of upper holes for forming the insulating support structures SP illustrated in FIG. 5.

Thereafter, the second insulating rings 152B may be formed in a manner similar to that described above with respect to the forming process of the first insulating rings 152A with reference to FIGS. 17A, 17B, and 17C, and the first insulating rings 152A filling the upper vertical holes may be formed. In an exemplary embodiment of the present inventive concept, the second sacrificial films S2 may include the same material as that of the first sacrificial films S1, but the present inventive concept is not limited thereto.

Figure 19A:
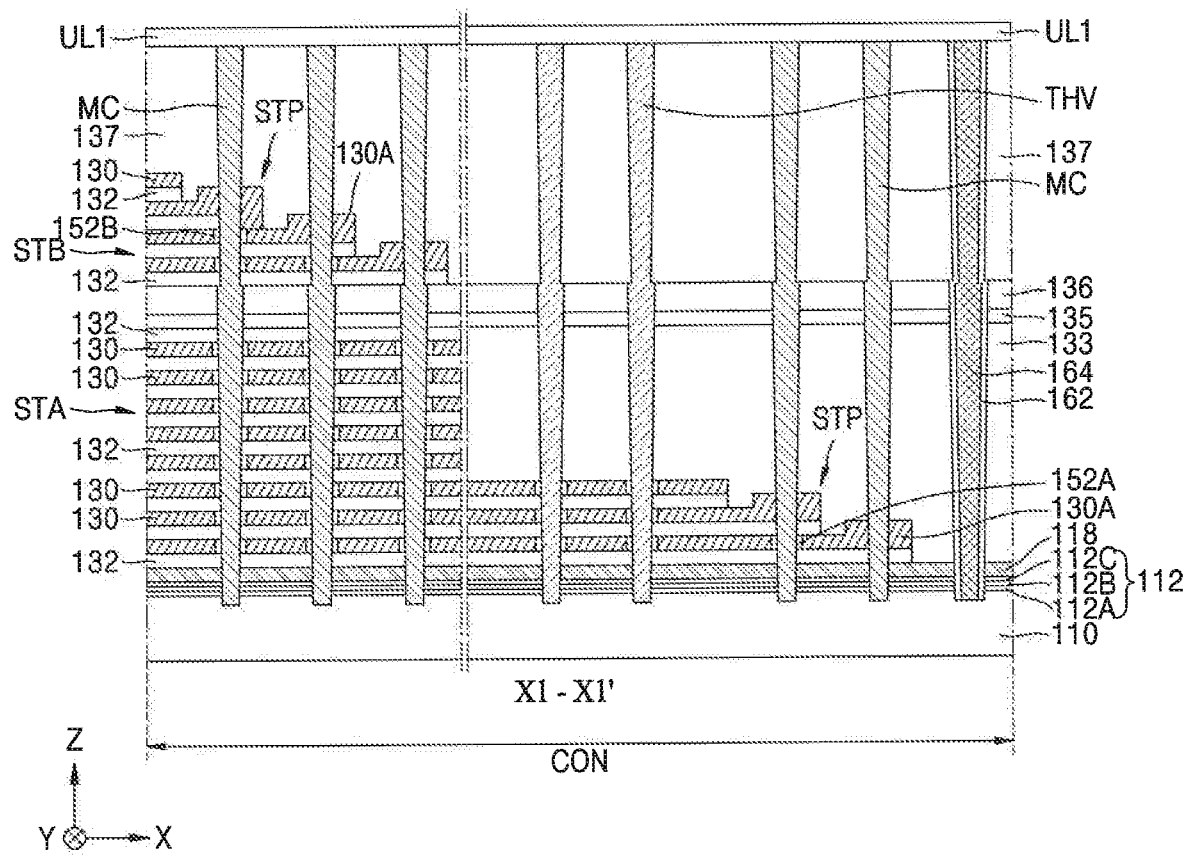
Figure 19B:
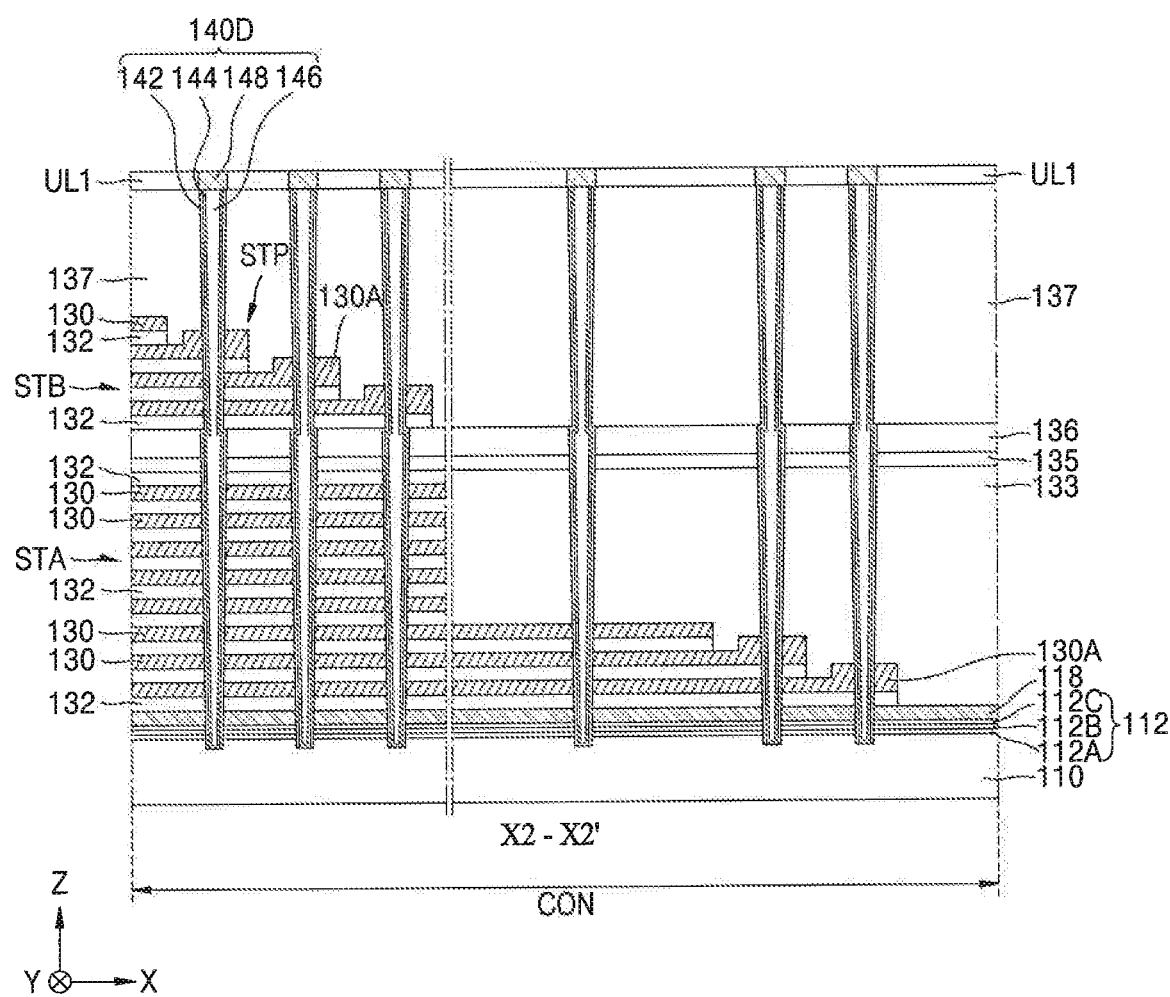
Figure 19C:
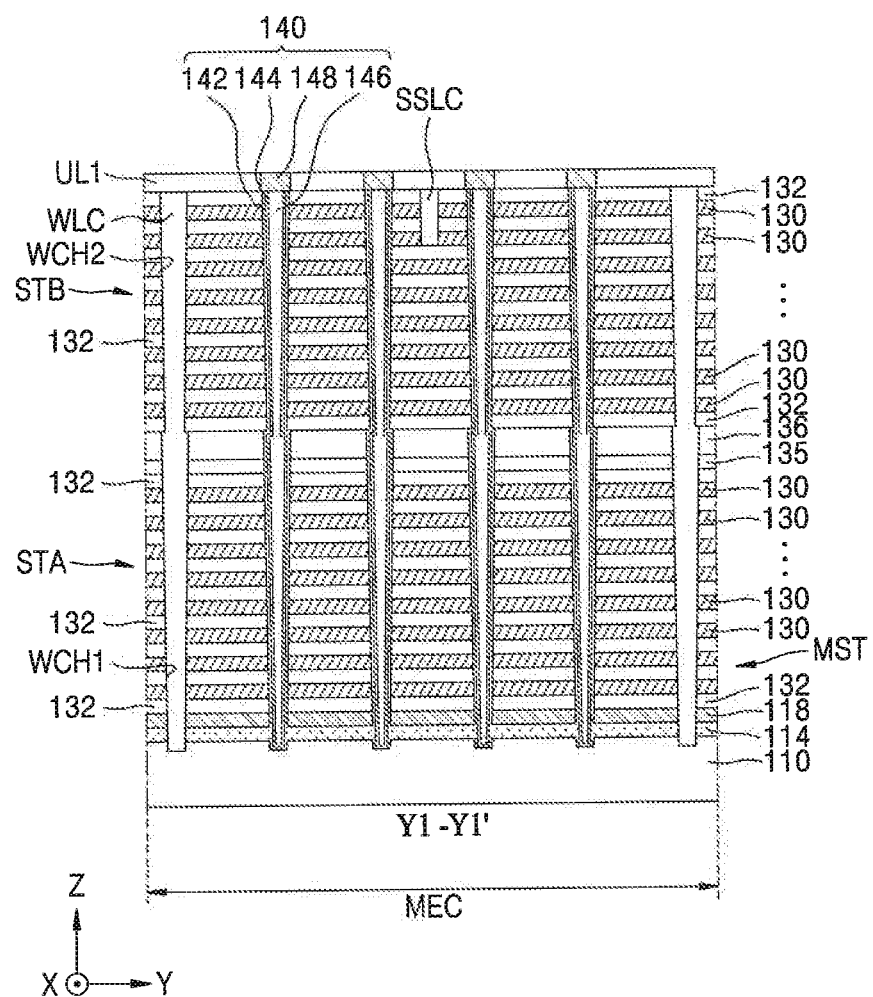

Referring to FIGS. 19A, 19B, and 19C, in a resultant structure of FIGS. 18A, 18B, and 18C, the first sacrificial films S1 and the second sacrificial films S2 may be sequentially substituted with a plurality of plug structures including the memory cell contacts MC, the insulating support structures SP, the through-electrodes THV, the channel structures 140, the dummy channel structures 140D, the word line cut structures WLC, the string select line cut structure SSLC, the conductive plate contact 164, and the insulating spacer 162 surrounding the conductive plate contact 164. The first upper insulating film UL1 may cover the plug structures may be formed in the connection region CON and the memory cell region MEC. A formation order of each of the memory cell contacts MC, the insulating support structures SP, the through-electrodes THV, the channel structures 140, the dummy channel structures 140D, the word line cut structures WLC, the string select line cut structure SSLC, the conductive plate contact 164, and the insulating spacer 162 may be variously selected as desired.

However, after the channel structures 140 and the dummy channel structures 140D are formed and before the word line cut structures WLC are formed, the first sacrificial films SI and the second sacrificial films S2 filling the lower word line cut holes WCH1 and the upper word line cut holes WCH2 may be removed. In addition, the insulating plate 112 may be selectively removed through the lower word line cut holes WCH1 and the upper word line cut holes WCH2 in the memory cell region MEC, among the memory cell region MEC and the connection region CON, and a resultant empty space may be filled with the first conductive plate 114. While the insulating plate 112 is removed in the memory cell region MEC, portions of the gate dielectric film 142 included in the channel structure 140 adjacent to the insulating plate 112 may be removed together with the insulating plate 112 together in the memory cell region MEC, and as a result, the first conductive plate 114 may pass through a portion of the gate dielectric film 142 in a horizontal direction to come into contact with the channel region 144.

In addition, after the first conductive plate 114 is formed and before the word line cut structures WLC is formed, the sacrificial insulating films 134 and the sacrificial pad portions 134S (refer to FIGS. 18A and 18B) may be substituted with the gate lines 130 and the conductive pad portions 130A in the memory cell region MEC and the connection region CON through the lower word line cut holes WCH1 and the upper word line cut holes WCH2. After the first conductive plate 114 and the gate lines 130 are formed, the word line cut structures WLC filling the lower word line cut holes WCH1 and the upper word line cut holes WCH2 may be formed.

Thereafter, the second upper insulating film UL2 sequentially covering the first upper insulating film UL1 and the drain regions 148 may be formed on a resultant structure of FIGS. 18A, 18B, and 18C. In addition, the contact plugs 172 passing through the first upper insulating film UL1 and the second upper insulating film UL2 may be formed in the connection region CON, and the upper wiring layers UM L may be formed on the second upper insulating film UL2 and the contact plugs 172 in the connection region CON. Further, the contact plugs 176 connected to the drain region 148 of the channel structures 140 through the second upper insulating film UL2 may be formed in the memory cell region MEC, and the bit lines BL connected to the contact plugs 176 may be formed on the second upper insulating film UL2. In addition, the third upper insulating film UL3 filling a space between the upper wiring layers UML and each of the plurality of bit lines BL may be formed to manufacture the semiconductor device 100 illustrated in FIGS. 4 to 6D.

The manufacturing method of the semiconductor device 100 illustrated in FIGS. 4 to 6D has been described with reference to FIGS. 13A to 19C, but those of ordinary skill in the art will understand that the semiconductor devices 200, 300, 400, 500, 600, and 700 described above with reference to FIGS. 7 to 12, according to an exemplary embodiment of the present inventive concept, may be manufactured by applying various modifications and changes from the processes described above with reference to FIGS. 13A to 19C without departing from the spirit and scope of the present inventive concept and that semiconductor devices, according to an exemplary embodiment of the present inventive concept, may be variously modified and changed without departing from the spirit and the scope of the present inventive concept.

Figure 20:
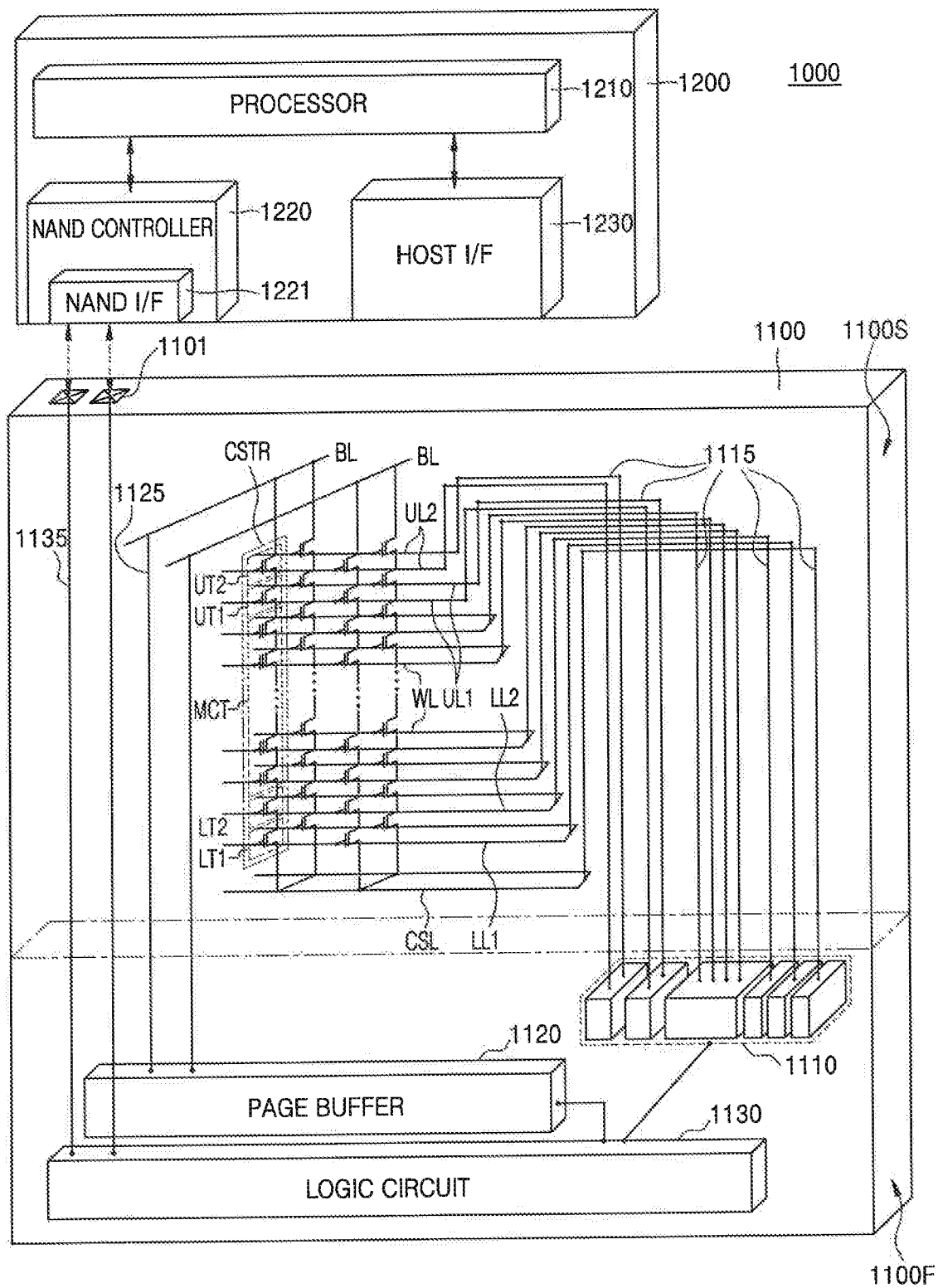
FIG. 20 is a view schematically illustrating an electronic system including a semiconductor device according to an exemplary embodiment of the present inventive concept.

FIG. 20 is a diagram schematically illustrating an electronic system 1000 including a semiconductor device 1100 according to an exemplary embodiment of the present inventive concept.

Referring to FIG. 20, the electronic system 1000 according to an exemplary embodiment of the present inventive concept may include a semiconductor device 1100 and a controller 1200 electrically connected to the semiconductor device 1100. The electronic system 1000 may be a storage device, which includes one or a plurality of semiconductor devices 1100, or may be an electronic device that includes a storage device. For example, the electronic system 1000 may be a solid state drive (SSD), a universal serial bus (USB), a computing system, a medical device, or a communication device including at least one semiconductor device 1100.

The semiconductor device 1100 may be a nonvolatile memory device. For example, the semiconductor device 1100 may be a NAND flash memory device including at least one of the structures described above regarding the semiconductor devices 100, 200, 300, 400, 500, 600, and 700 described above with reference to FIGS. 4 to 12. The semiconductor device 1100 may include a first structure 1100F and a second structure 1100S disposed on the first structure 1100F. In an exemplary embodiment of the present inventive concept, the first structure 1100F may be disposed next to the second structure 1100S. For example, the first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to an exemplary embodiment of the present inventive concept.

In an exemplary embodiment of the present inventive concept, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2.

The common source line CSL, the gate lower lines LL1 and LL2, the word lines WL, and the gate upper lines UL1 and UL2 may be electrically connected to the decoder circuit 1110 through a plurality of first connection wirings 1115 extending from the first structure 1100F to the second structure 1100S. The bit lines BL may be electrically connected to the page buffer 1120 through a plurality of second connection wirings 1125 extending from the first structure 1100F to the second structure 1100S.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The semiconductor device 1100 may communicate with the controller 1200 through the I/O pad 1101 electrically connected to the logic circuit 1130. The I/O pad 1101 may be electrically connected to the logic circuit 1130 through an I/O connection wiring 1135 extending from the first structure 1100F to the second structure 1100S.

The controller 1200 may include a processor 1210, a NAND controller 1220, and a host interface (I/F) 1230. In an exemplary embodiment of the present inventive concept, the electronic system 1000 may include a plurality of semiconductor devices 1100, and in this case, the controller 1200 may control the semiconductor devices 1100.

The processor 1210 may control an overall operation of the electronic system 1000 including the controller 1200. The processor 1210 may operate according to a certain firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, and data to be read from a plurality of memory cell transistors MCT of the semiconductor device 1100 may be transmitted. The host I/F 1230 may provide a communication function between the electronic system 1000 and an external host. When a control command is received from an external host through the host I/F 1230, the processor 1210 may control the semiconductor device 1100 in response to the control command.

Figure 21:
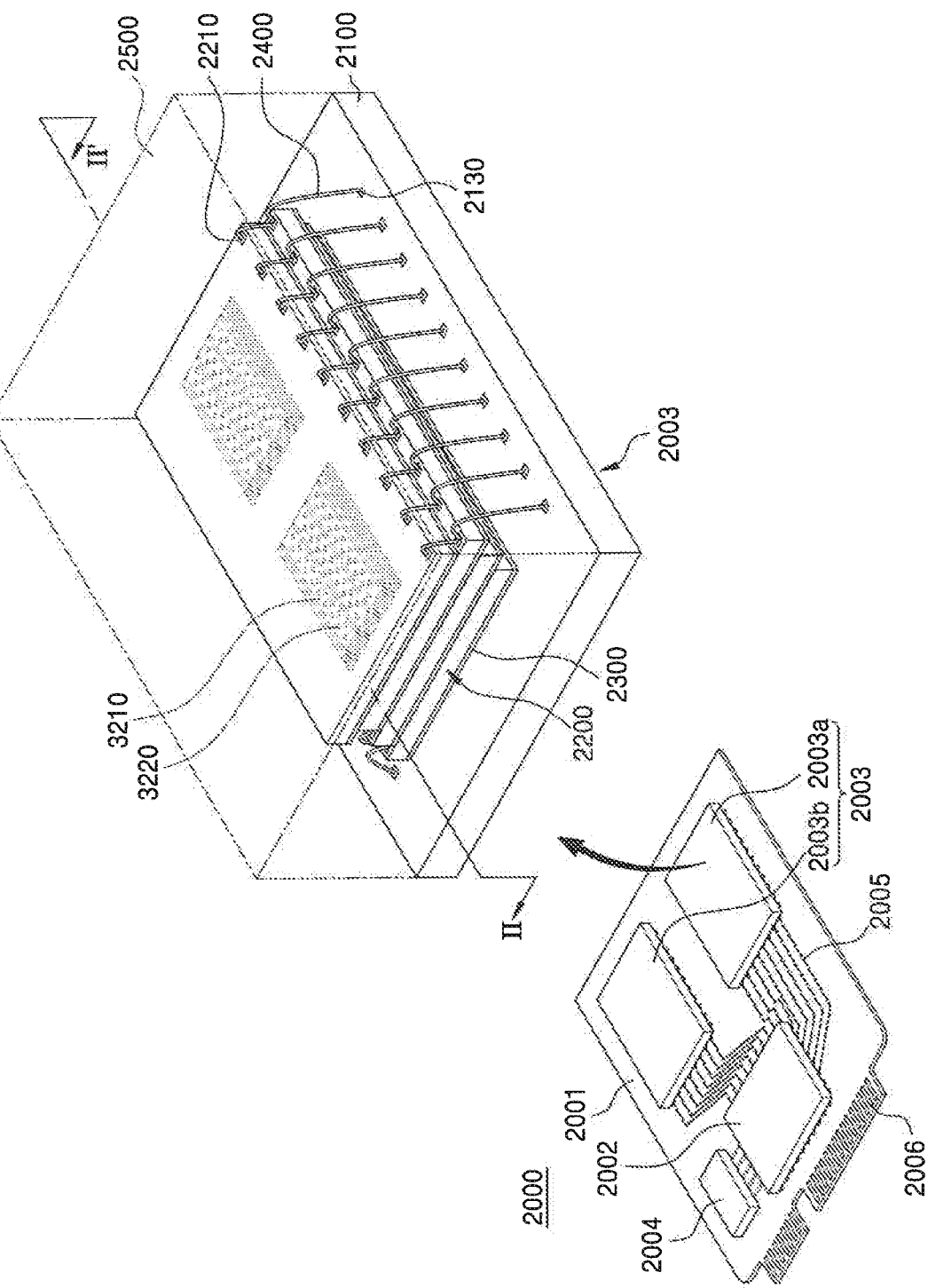
FIG. 21 is a schematic perspective view of an electronic system including a semiconductor device according to an exemplary embodiment of the present inventive concept.

FIG. 21 is a perspective view schematically illustrating an electronic system 2000 including a semiconductor device according to an exemplary embodiment of the present inventive concept.

Referring to FIG. 21, the electronic system 2000 according to an exemplary embodiment of the present inventive concept may include a main board 2001, a controller 2002 mounted on the main board 2001, one or more semiconductor packages 2003, and a DRAM 2004. The semiconductor package 2003 and the DRAM 2004 may be connected to the controller 2002 by a plurality of wiring patterns 2005 formed on the main board 2001.

The main board 2001 may include a connector 2006 including a plurality of pins coupled to an external host. The number and arrangement of the pins of the connector 2006 may vary depending on a communication interface between the electronic system 2000 and the external host. In an exemplary embodiment of the present inventive concept, the electronic system 2000 may communicate with an external host according to any one of interfaces such as a universal serial bus (USB), a peripheral component interconnect express (PCI-Express), a serial advanced technology attachment (SATA), M-Phy for a universal flash storage (UFS), etc. In an exemplary embodiment of the present inventive concept, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may increase an operating speed of the electronic system 2000.

The DRAM 2004 may be a buffer memory for mitigating a speed difference between the semiconductor package 2003, that acts as a data storage space, and the external host. The DRAM 2004 included in the electronic system 2000 may also operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, a plurality of semiconductor chips 2200 on the package substrate 2100, an adhesive layer 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board (PCB) including a plurality of package upper pads 2130. Each of the semiconductor chips 2200 may include an input/output (I/O) pad 2210. The I/O pad 2210 may correspond to the I/O pad 1101 of FIG. 19. Each of the semiconductor chips 2200 may include a plurality of gate stacks 3210 and a plurality of channel structures 3220. Each of the semiconductor chips 2200 may include at least one of the semiconductor devices 100, 200, 300, 400, 500, 600, and 700 described above with reference to FIGS. 4 to 12.

In an exemplary embodiment of the present inventive concept, the connection structure 2400 may be a bonding wire electrically connecting the I/O pad 2210 to the package upper pad 2130. Accordingly, in the first and second semiconductor packages 2003a and 2003b, the semiconductor chips 2200 may be electrically connected to each other by a bonding wire method, and may be electrically connected to the package upper pad 2130 of the package substrate 2100. In an exemplary embodiment of the present inventive concept, in the first and second semiconductor packages 2003a and 2003b, the semiconductor chips 2200 may be electrically connected to each other by a connection structure including a through-silicon via (TSV), instead of the bonding wire type connection structures 2400.

In an exemplary embodiment of the present inventive concept, the controller 2002 and the semiconductor chips 2200 may be included in a single package. In an exemplary embodiment of the present inventive concept, the controller 2002 and the semiconductor chips 2200 may each be mounted on a separate interposer substrate different from the main substrate 2001, and the controller 2002 may be connected to the semiconductor chips 2200 by a wiring formed on the interposer substrate.

Figure 22:
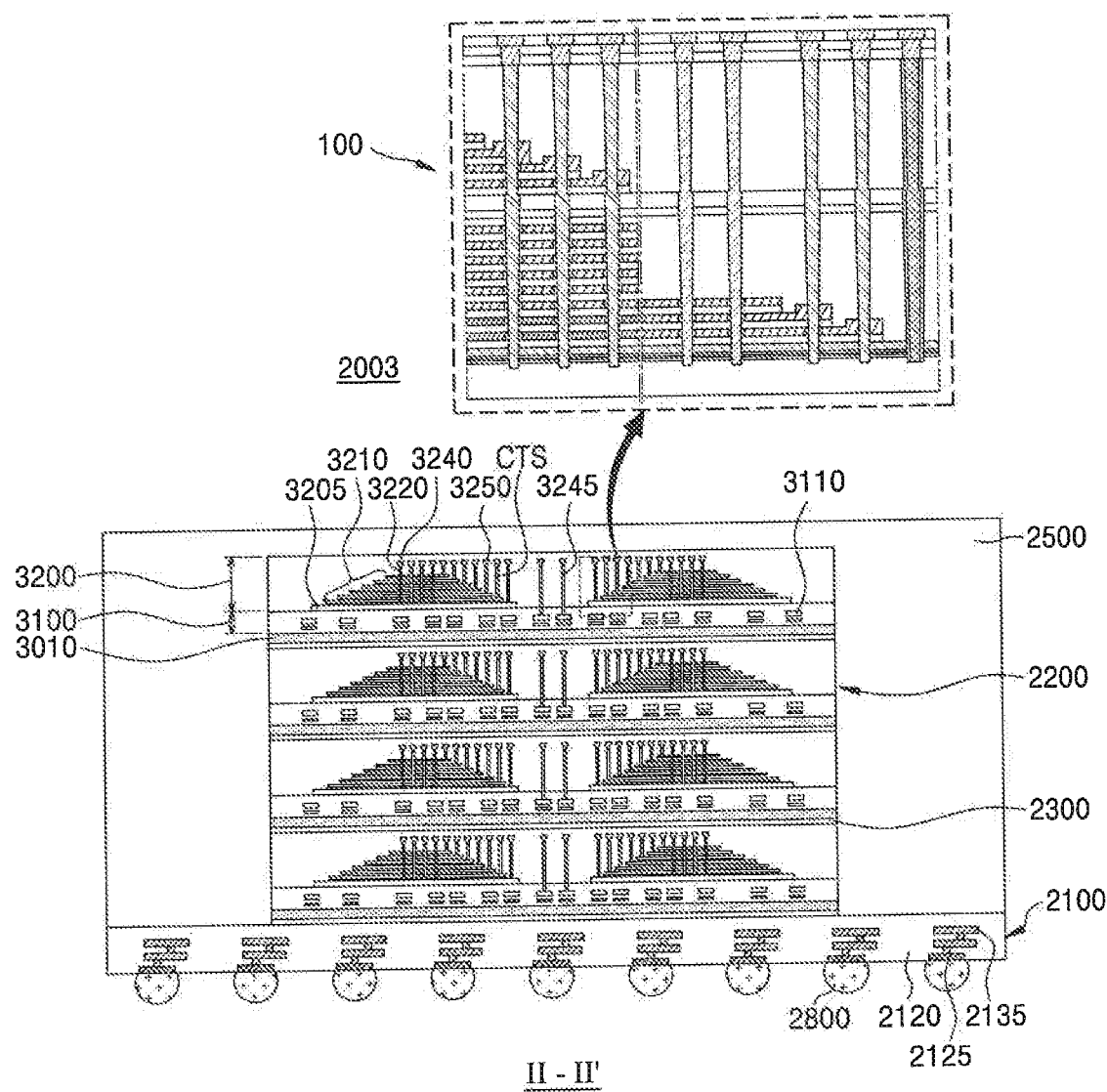
FIG. 22 is a cross-sectional view schematically illustrating semiconductor packages according to an exemplary embodiment of the present inventive concept.

FIG. 22 is a cross-sectional view schematically illustrating semiconductor packages according to an exemplary embodiment of the present inventive concept. FIG. 22 illustrates a configuration along a cross-section taken along line II-II' of FIG. 21.

Referring to FIG. 22, in a semiconductor package 2003, the package substrate 2100 may be a PCB. The package substrate 2100 may include a package substrate body portion 2120, a plurality of package upper pads 2130 (refer to FIG. 21) disposed on an upper surface of the package substrate body portion 2120, a plurality of lower pads 2125 disposed on a lower surface of the package substrate body portion 2120 and/or exposed through the lower surface of the package substrate body portion 2120, and a plurality of internal wirings 2135 electrically connecting the upper pads 2130 to the lower pads 2125 inside the package substrate body portion 2120. The upper pads 2130 may be electrically connected to the connection structures 2400. The lower pads 2125 may be connected to the wiring patterns 2005 on the main board 2001 of the electronic system 2000 illustrated in FIG. 21 through a plurality of conductive connection portions 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wirings 3110. The second structure 3200 may include a common source line 3205, a gate stack 3210 disposed on the common source line 3205, a channel structure 3220 passing through the gate stack 3210, and a bit line 3240 electrically connected to the channel structure 3220. In an exemplary embodiment of the present inventive concept, each of the semiconductor chips 2200 may include the same configuration as described above regarding the semiconductor devices 100, 200, 300, 400, 500, 600, and 700 described above with reference to FIGS. 4 to 12.

Each of the semiconductor chips 2200 may include a through-wiring 3245 electrically connected to the peripheral wirings 3110 of the first structure 3100 and extending into the second structure 3200. The through-wiring 3245 may be disposed outside the gate stack 3210. In an exemplary embodiment of the present inventive concept, the semiconductor package 2003 may further include a through-wiring passing through the gate stack 3210. Each of the semiconductor chips 2200 may further include an I/O pad (2210 of FIG. 21) electrically connected to the peripheral wirings 3110 of the first structure 3100.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor device comprising:
a stepped connection portion having a plurality of conductive pad portions disposed on a substrate;
an insulating block covering the plurality of conductive pad portions, wherein the insulating block has a first surface and a second surface, wherein the first surface faces the stepped connection portion, wherein the second surface is flat and extends in a direction parallel to a first surface of the substrate, wherein the insulating block includes a silicon oxide film doped with a dopant element including a metalloid element or a non-metal element, wherein the dopant element has an atomic weight within a range of 5 to 15; and
a first plug structure passing through the insulating block in a vertical direction with respect to the first surface of substrate,
wherein the first plug structure includes:

a memory cell contact electrically connected to one conductive pad portion of the plurality of conductive pad portions, and a through-electrode passing through the insulating block and at least one conductive pad portion of the plurality of conductive pad portions in the vertical direction and configured not to be electrically connected to the plurality of conductive pad portions, wherein a first surface of the memory cell contact and a first surface of the through-electrode are at a same vertical level with respect to the first surface of the substrate, and a doping concentration of the dopant element in the insulating block is from about 0.1 atom % to about 2 atom %.

2. The semiconductor device of claim 1, wherein the dopant element includes one of phosphorus (P), nitrogen (N), boron (B), fluorine (F), or carbon (C).

3. The semiconductor device of claim 1, wherein the doping concentration of the dopant element in the insulating block is constant according to a position in the insulating block.

4. The semiconductor device of claim 1, wherein the insulating block does not include carbon (C).

5. The semiconductor device of claim 1, further comprising a second plug structure including at least one of:

a memory cell contact electrically connected to one conductive pad portion of the plurality of conductive pad portions and passing through the insulating block in the vertical direction, a dummy channel structure passing through the insulating block and the stepped connection portion in the vertical direction, a through-electrode passing through the insulating block and at least one conductive pad portion of the plurality of conductive pad portions in the vertical direction and configured not to be electrically connected to the plurality of conductive pad portions, or a conductive plate contact passing through the insulating block in the vertical direction and extending to the substrate.

6. The semiconductor device of claim 1, further comprising:

a peripheral circuit structure including a lower substrate, a plurality of circuits disposed between the lower substrate and the substrate, and a plurality of wiring layers connected to the plurality of circuits, wherein the through-electrode of the first plug structure passes through the stepped connection portion and the substrate in the vertical direction, wherein the through-electrode of the first plug structure extends to the peripheral circuit structure, and is connected to at least one wiring layer of the plurality of wiring layers.

7. A semiconductor device comprising:

a substrate including a memory cell region and a connection region;

a first stack disposed at a first vertical level on the substrate and including a plurality of lower gate lines and a lower stepped connection portion, wherein the plurality of lower gate lines overlap each other in a vertical direction, with respect to an upper surface of the substrate, in the memory cell region, and the lower stepped connection portion is disposed in the connection region and has a plurality of lower conductive pad portions integrally connected to the plurality of lower gate lines;

a second stack disposed at a second vertical level higher than the first vertical level on the substrate and including a plurality of upper gate lines and an upper stepped connection portion, wherein the plurality of upper gate lines overlap each other in the vertical direction in the memory cell region, and the upper stepped connection portion is disposed in the connection region and has a plurality of upper conductive pad portions integrally connected to the plurality of upper gate lines;

a lower insulating block covering the lower stepped connection portion;

an upper insulating block covering the upper stepped connection portion and the lower insulating block; and at least one plug structure passing through the lower insulating block and the upper insulating block in the vertical direction, wherein the lower insulating block and the upper insulating block each include a silicon oxide film doped with a first dopant element including a metalloid element or a non-metal element, and wherein the first dopant element has an atomic weight within a range of 5 to 15, wherein the lower insulating block and the upper insulating block each include the same doping concentration of the first dopant element, and wherein the doping concentration of the first dopant element in the lower insulating block and the upper insulating block is from about 0.1 atom % to about 2 atom %.

8. The semiconductor device of claim 7, wherein the first dopant element includes one of phosphorus (P), nitrogen (N), boron (B), fluorine (F), or carbon (C).

9. The semiconductor device of claim 7, wherein the at least one plug structure includes a plurality of memory cell contacts passing through the lower insulating block and the upper insulating block in the vertical direction, and wherein each of the plurality of memory cell contacts is electrically connected to one of a lower conductive pad portion of the plurality of lower conductive pad portions or an upper conductive pad portion of the plurality of upper conductive pad portions.

10. The semiconductor device of claim 7, wherein the at least one plug structure includes a plurality of dummy channel structures passing through at least one of the lower insulating block or the upper insulating block in the vertical direction and passing through at least one of the lower stepped connection portion or the upper stepped connection portion.

11. The semiconductor device of claim 7, wherein the at least one plug structure includes a plurality of dummy insulating structure passing through the lower insulating block and the upper insulating block in the vertical direction and passing through at least one lower gate line of the plurality of lower gate lines.

12. The semiconductor device of claim 7, further comprising:

a peripheral circuit structure including a lower substrate, a plurality of circuits disposed between the lower substrate and the substrate, and a plurality of wiring layers connected to the plurality of circuits, wherein the at least one plug structure includes a plurality of through-electrodes passing through at least one of the lower insulating block or the upper insulating block in the vertical direction, wherein the plurality of through-electrodes extends to the peripheral circuit structure through at least one of the lower stepped connection portion and the upper stepped connection portion, and is connected to at least one wiring layer of the plurality of wiring layers.

13. The semiconductor device of claim 7, further comprising:

an intermediate insulating film interposed between the lower insulating block and the upper insulating block at a third vertical level between the first vertical level and the second vertical level and including a silicon oxide film doped with a second dopant element including a metalloid element or a non-metal element, wherein the second dopant element has an atomic weight within a range of 5 to 15, and wherein the at least one plug structure passes through the intermediate insulating film in the vertical direction.

14. The semiconductor device of claim 7, further comprising:

an intermediate insulating film interposed between the lower insulating block and the upper insulating block at a third vertical level between the first vertical level and the second vertical level and including a silicon oxide film doped with a second dopant element including a metalloid element or a non-metal element, wherein the second dopant element has an atomic weight within a range of 5 to 15, and wherein the first dopant element and the second dopant element are same, and the doping concentration of the first dopant element in the upper insulating block and the lower insulating block and a doping concentration of the second dopant element in the intermediate insulating film are same.

15. An electronic system comprising:

a main substrate;

a semiconductor device disposed on the main substrate; and a controller electrically connected to the semiconductor device, wherein the semiconductor device includes:

a stepped connection portion having a plurality of conductive pad portions disposed on a substrate;

an insulating block disposed on the plurality of conductive pad portions, wherein the insulating block has a lower surface and an upper surface, wherein the lower surface faces the stepped connection portion, and the upper surface extends in a direction parallel to a main surface of the substrate, wherein the insulating block includes a silicon oxide film doped with a dopant element including a metalloid element or a non-metal element, and wherein the dopant element has an atomic weight within a range of 5 to 15; and at least one plug structure passing through the insulating block in a vertical direction with respect to a first surface of substrate, wherein the at least one plug structure includes:

a memory cell contact electrically connected conductive pad portion of the plurality of conductive pad portions; and a through-electrode passing through the insulating block and at least one conductive pad portion of the plurality of conductive pad portions in the vertical direction and configured not to be electrically connected to the plurality of conductive pad portions, wherein a first surface of the memory cell contact and a first surface of the through-electrode are at a same vertical level with respect to the first surface of the substrate, and wherein the doping concentration of the dopant element in the insulating block is from about 0.1 atom % to about 2 atom %.

16. The electronic system of claim 15, wherein the main substrate further includes wiring patterns electrically connecting the semiconductor device to the controller, and wherein the dopant element includes one of phosphorus (P), nitrogen (N), boron (B), fluorine (F), or carbon (C).

* * * * *